(12) United States Patent
Crivello

(10) Patent No.: US 6,863,701 B2
(45) Date of Patent: Mar. 8, 2005

(54) ACCELERATORS FOR CATIONIC PHOTOPOLYMERIZATIONS

(75) Inventor: James Vincent Crivello, Clifton Park, NY (US)

(73) Assignee: Rensselaer Polytechnic Institute, Troy, NY (US)

(*) Notice: Subject to any disclaimer, the term of this patent is extended or adjusted under 35 U.S.C. 154(b) by 67 days.

(21) Appl. No.: 10/384,946

(22) Filed: Mar. 10, 2003

(65) Prior Publication Data

US 2003/0176519 A1 Sep. 18, 2003

Related U.S. Application Data

(60) Provisional application No. 60/362,680, filed on Mar. 8, 2002.

(51) Int. Cl.[7] .................................................. C08F 2/46
(52) U.S. Cl. .................... 55/170; 522/168; 522/154; 522/178; 522/181; 522/31; 522/32; 522/33
(58) Field of Search ........................ 522/31, 32, 33, 522/38, 64, 65, 69, 68, 66, 168, 170, 154, 178, 181, 100, 26, 27, 28, 25, 70

(56) References Cited

U.S. PATENT DOCUMENTS

| | | | |
|---|---|---|---|
| 3,591,661 A | 7/1971 | Rogers | 260/897 |
| 4,058,400 A | 11/1977 | Crivello | 96/86 |
| 4,339,567 A | 7/1982 | Green et al. | 528/102 |
| 4,593,052 A | 6/1986 | Irving | 522/31 |
| 4,694,029 A | 9/1987 | Land | 522/8 |
| 4,921,589 A | 5/1990 | Yates et al. | 204/157.5 |
| 6,043,295 A | 3/2000 | Oxman et al. | 522/14 |
| 6,093,753 A | 7/2000 | Takahashi | 522/25 |
| 6,187,833 B1 | 2/2001 | Oxman et al. | 522/15 |
| 6,313,188 B1 | 11/2001 | Takahashi | 522/25 |

FOREIGN PATENT DOCUMENTS

| | | |
|---|---|---|
| EP | 0389927 A2 | 3/1990 |
| EP | 0 938 026 A1 | 8/1999 |
| WO | WO 00/64572 | 4/1999 |

OTHER PUBLICATIONS

Crivello, Geschwindigkeitsbestimmende Faktoren bei der kationischen UV–Hartung, Oct., 1987, Forschung & Entwicklung.

Crivello et al., Accelerators in UV Cationic Polymerization, Sep. 21, 1988, Society of Manufacturing Engineers, vol. 178.

(List continued on next page.)

*Primary Examiner*—James J. Seidleck
*Assistant Examiner*—Sanza L. McClendon
(74) *Attorney, Agent, or Firm*—Heslin Rothenberg Farley & Mesiti P.C.; Mary Louise Gioeni, Esq.

(57) ABSTRACT

Compositions that can be photopolymerized by a cationic initiator at an accelerated rate include at least one epoxy monomer, at least one cationic photoinitiator, and a photosensitizer/accelerator. The accelerator is a phenolic resole, or a compound having a structure according to the formula $$R^1(CR^2R^3OH)_n,$$

wherein $R^1$ is selected from phenyl, polycyclic aryl, and polycyclic heteroaryl, each optionally substituted with one or more electron donating group substituted phenyl;

$R^2$ and $R^3$ are independently selected from hydrogen, alkyl, aryl, alkylaryl, substituted alkyl, substituted aryl and substituted alkylaryl; and n is an integer from 1 to 10.

26 Claims, 18 Drawing Sheets

OTHER PUBLICATIONS

Chen, Y.; Yamamura, T.; Igarashi, K. J. Polym. Sci. Part A: Polym. Chem. 2000, 38, 90.

Hua, Y.; Crivello, J.V.J. Polym. Sci. Part A: Polym. Chem. 2000, 38, 3697.

Hua, Y.; Crivello, J.V. , Macromolecules 2001, 34, 2488.

Gomurashvili, Z.; Crivello, J.V.J. Polym. Sci. Part A: Polym. Chem. 2001, 39, 1187.

Rodrigues, M.R.; Neumann, M.G.J. Polym. Sci. Part A: Polym. Chem. 2001, 39, 46.

Crivello, J.V.; Lee, J.L. Macromolecules 1983, 16, 864.

Denizligil, S.; Resul, R.; Yagci, Y.; McArdle, C.; Fouassier, J.–P. Macromol. Chem. Phys. 1996, 197, 1233.

Crivello, J.V.; Lam, J.H.W.J. Polym. Sci. Part A: Polym. Chem. 1979, 17, 1059.

Nagashima, et al., Organometallics, 1995, 14, 2868–2879.

ACCELERATORS FOR CATIONIC PHOTOPOLYMERIZATIONS

CROSS-REFERENCE TO RELATED APPLICATIONS

This application claims priority from U.S. Provisional Application Ser. No. 60/362,680, filed Mar. 8, 2002, the entire contents of which are incorporated herein by reference.

FIELD OF THE INVENTION

The invention relates to cationically photopolymerizable compositions and cationic photopolymerization processes.

BACKGROUND OF THE INVENTION

As part of the continuing effort to reduce the environmental impact of various industrial chemical processes, there has been a strong emphasis in developing new methodology for the application and cure of organic coatings. While these ubiquitous materials are absolutely essential to modern life, they also constitute one of the primary industrial sources of emissions of volatile organic solvents that contribute to air and water pollution. The use of photopolymerizations for the fabrication of decorative and protective organic coatings is one solution to this problem that is receiving increasing acceptance as this technology matures and as more users gain experience in applying it to their specific requirements.

Two main types of monomer compositions are commonly used in photopolymerization processes, acrylate and epoxy. It is widely recognized that the cationic photopolyinerization of epoxy compositions is slower than free radical photopolymerization of acrylate monomers. For this reason, although photocured epoxies generally have better properties than their acrylate counterparts, these materials are not commonly used for high speed applications such as printing inks and rapid imaging techniques.

One method for increasing or accelerating the polymerization rate of epoxy monomers in cationically photoinitiated processes is through the use of photosensitizers. In fact, photosensitizers are critical to the success of cationic photopolymerizations in many applications in which photopolymerizations are employed. When broad band emitting light sources are used, the additional spectral sensitivity provided by a photosensitizer often permits the capture of a higher fraction of the available light emitted from most common UV irradiation sources. As a result, more efficient photolysis of the photoinitiator takes place generating a larger number of initiating species that produces an apparent acceleration of the rate of polymerization of the monomer as compared to when the photosensitizer is absent. In addition, there is currently a tendency toward the use of monochromatic light sources such as lasers and light emitting diodes for imaging applications; use of photosensitizers may be necessary when these light sources emit at wavelengths not absorbed by the photoinitiator.

Polycyclic or polynuclear aromatic compounds are known photosensitizers for photolysis of onium salts. These compounds are readily available and, in many cases, inexpensive starting materials. Further, they generally have very rich and strongly absorbing UV and visible absorption spectra with the potential for sensitization in the very important long wavelength UV and the visible regions. Monomeric and polymeric compounds containing the carbazole nucleus have been described by Chen, et al (Chen, Y.; Yamamura, T.; Igarashi, K. *J. Polym. Sci. Part A: Polym. Chem.* 2000, 38, 90) and by the inventor of the present subject matter (Hua, Y.; Crivello, J. V. *J. Polym. Sci. Part A. Polym. Chem.* 2000, 38, 3697; Hua, Y.; Crivello, J. V., *Macromolecules* 2001, 34, 2488). Phenothiazine derivatives have also been reported as a new class of photosensitizers that can be employed for onium salt photoinitiators (Gomurashvili, Z.; Crivello, J. V. *J. Polym. Sci. Part A: Polym. Chem.* 2001, 39, 1187; Rodriguez, M. R.; Neumann, M. G. *J. Polym. Sci. Part A: Polym. Chem.* 2001, 39, 46; Crivello, J. V.; Lee, J. L. *Macromolecules* 1983, 16, 864; Denizligil, S.; Resul, R.; Yagci, Y.; McArdle, C.; Fouassier, J.-P. *Macromol. Chem. Phys.* 1996, 197, 1233). Among the most efficient photosensitizers for onium salts that have been discovered are electron-rich polynuclear aromatic compounds such as anthracene, pyrene and perylene (dibenz[DE, KL] anthracene) (Crivello, J. V.; Lam, J. H. W. *J. Polym. Sci. Part A: Polym. Chem.* 1979, 17, 1059). U.S. Pat. No. 6,313,188, to Takahashi, discloses photocatalytic compositions containing polycyclic aromatic compounds and carbazole derivatives, substituted with a hydroxy group, an optionally-substituted aralkyloxy group or an alkoxy group, including optionally substituted 9,10-dialkoxyanthracenes and 9,10-diaralkyloxyanthracenes, and, specifically, 9,10-dimethoxyanthracene, 9,10-diethoxyanthracene, 9,10-dibenzyloxyanthracene and 2-ethyl-9,10-dimethoxyanthracene. The compositions are reported to cure at an accelerated rate. Yet, despite the many potential applications for this class of photosensitizers, they have received little attention. This results from several major deficits associated with these compounds: First, they tend to be poorly soluble in most monomers and, second, many have high vapor pressures at room temperature and are thus easily lost from thin film coatings during polymerization. Third, phenolic-type photosensitizer compounds, that is polycyclic aromatics substituted with a hydroxy group, such as those described in U.S. Pat. No. 6,313,188, are subject to oxidation and yellow or darken as a result. This can be a problem in clear coating applications, or where a pigment is utilized. Finally, most, if not all, of the polynuclear aromatic hydrocarbons that have been disclosed as photosensitizers for cationic polymerizations are toxic. Toxicity is of concern not only in the context of safety in the workplace where the formulation and polymerization of the compositions is performed, but also in the final application, where toxic compounds that are not bound into the polymer network can be leached out. In particular, for applications where the cured compositions may be in contact with food, it is essential to use photosenzitizers that become bound to the growing chain during the polymerization. It is, therefore, of considerable value to find non-phenolic photosensitizers that may be chemically incorporated into the polymer network and by which the rate of the photopolymerization of epoxy compositions can be conveniently and simply accelerated to put them on par with photocurable acrylates.

SUMMARY OF THE INVENTION

Figure 1:
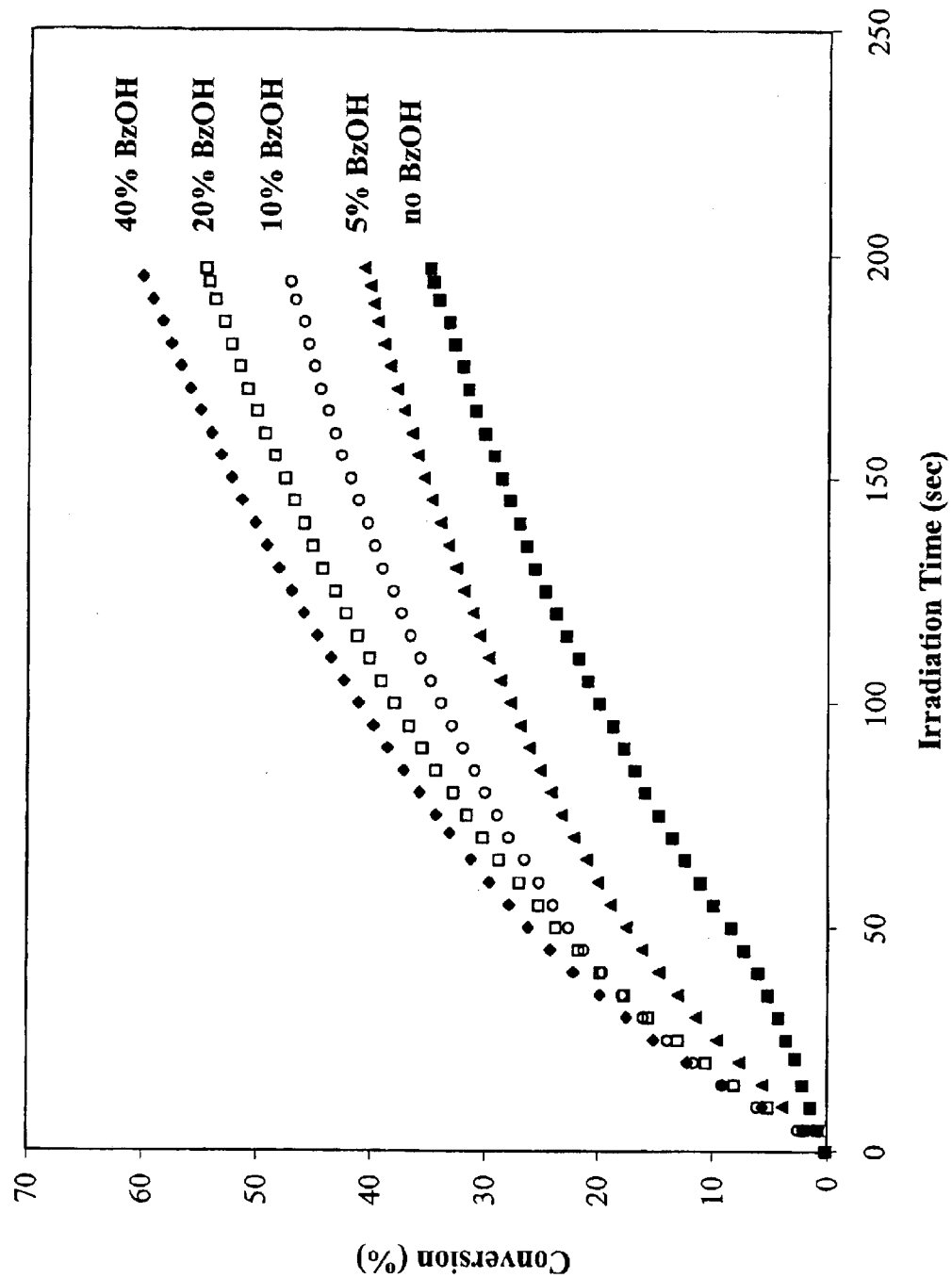
FIG. 1—FT-RTIR Study of the photopolyinerization of VCHDO in the presence of various amounts of benzyl alcohol (photoinitiator, 0.1% IOC10; light intensity 150 mJ/cm$^2$min).

It has been unexpectedly discovered that aromatic compounds containing hydroxymethyl or substituted hydroxymethyl substituents are effective photosensitizers, and cure accelerators, for epoxy compounds. These compounds have reduced toxicity and increased solubility in formulations, in comparison with unsubstituted analogs. Most importantly, the compounds participate in the polymerization reaction, and thereby become incorporated into the polymer. As a result, the effectiveness of the photosensitizer is maximized because volatility is reduced, and toxicity is minimized because the photosensitizer is not available to the environment.

Accordingly, in one aspect, the present invention relates to cationically photopolymerizable compositions comprising at least one epoxy monomer, at least one cationic photoinitiator, and an accelerator comprising a phenolic resole, or one or more compounds having a structure according to formula I:

$$R^1(CR^2R^3OH)_n \qquad \text{I}$$

wherein
 $R^1$ is selected from phenyl, polycyclic aryl, and polycyclic heteroaryl, each optionally substituted with one or more electron donating group;
 $R^2$ and $R^3$ are independently selected from hydrogen, alkyl, aryl, alkylaryl, substituted alkyl, substituted aryl and substituted alkylaryl; and
 n is an integer from 1 to 10.
The aqueous dissociation constant (pK) of the compounds of formula I is greater than 4.0.

With most monomers, the polymerization rate can be increased by at least a factor of two when these accelerators are included in a formulation. A ten-fold, or even greater, increase in the photopolymerization rate has been observed in many cases.

DETAILED DESCRIPTION OF THE INVENTION

In one aspect, the present invention relates to cationically photopolymerizable compositions comprising:
 at least one epoxy monomer;
 at least one cationic photoinitiator; and
 at least one accelerator selected from phenolic resoles and compounds of formula I:

$$R^1(CR^2R^3OH)_n \qquad \text{I}$$

where $R^1$ is selected from phenyl, polycyclic aryl, and polycyclic heteroaryl, each optionally substituted with one or more electron donating group; $R^2$ and $R^3$ are independently selected from hydrogen, alkyl, aryl, alkylaryl, substituted alkyl, substituted aryl and substituted alkylaryl; n is an integer from 1 to 10.

The accelerators have an aqueous dissociation constant (pK) greater than 4.0, that is, they are non-basic. Basic compounds may react with the acidic photoinitiators of the compositions of the present invention, reducing the effective amount thereof. For example, heteroaryl compounds derived from basic heteroaromatic ring systems, such as pyridine (pK 5.25), morpholine (pK 8.33) and pyrrole (pK 11.27), are typically not suitable as accelerators in the compositions and processes of the present invention.

In formula I, $R^1$ may be monocyclic aryl, typically phenyl, polycyclic aryl, or polycyclic heteroaryl, each optionally substituted with one or more electron donating group. In some embodiments, $R^1$ may be additionally substituted with one or more electron withdrawing groups, or one or more electronically inactive groups. Polycyclic aryl groups are those derived from polycyclic aromatic hydrocarbons (PAH), and particularly, fused systems (fused carbocycles) as defined by the Chemical Abstracts Index Guide, 1997 edition, that is, having at least two rings of five or more members and containing only "ortho" or "ortho- and peri-" fusions. Examples of these include, but are not limited to, naphthalene, fluorene, phenanthrene, anthracene, pyrene and perylene. Likewise, polycyclic heteroaryl groups are those derived from polycyclic heteroaromatic compounds, particularly, fused systems (fused heterocycles), such as carbazole, phenothiazine, and thianthrene. Any polycyclic aryl or heteroaryl compounds may be used, although, for some, low solubility in epoxy formulations, and/or concerns regarding toxicity, may limit their use. Fortunately, the hydroxymethyl-substituted accelerators described herein typically have higher solubility and lower toxicity than their unsubstituted parents.

The ring systems from which $R^1$ is selected may be substituted with at least one electron donating group, if desired. An electron donating group is a group that can donate electrons to or share electrons with aromatic or heteroaromatic ring(s) to which they are attached. Examples include monovalent groups, such as alkoxy, especially methoxy, hydroxy; aryl, especially phenyl; and alkyl, especially methyl, as well as divalent groups, such as —$OCH_2O$—. Where the electron donating group(s) is divalent, the ring system is substituted in two positions with the divalent group. An example of an accelerator in which the ring system is substituted with a divalent electron donating group is piperonyl alcohol. As noted above, it may be desirable to limit substituents to non-basic groups. In some cases, the electron donating groups may be present on a ring along with electron withdrawing or electronically inactive substitutents, such as nitro, cyano, halo, sulfonate, or carboxylate. It has been found that, in many cases, the presence of electron donating substitutents on the ring produces a very strong accelerating effect on cationic polymerization.

In formula I, $R^2$ and $R^3$ may be hydrogen, alkyl, aryl, alkylaryl, substituted alkyl, substituted aryl or substituted alkylaryl. In particular, one or both of $R^2$ and $R^3$ may be hydrogen, methyl or phenyl. More particularly, $R^2$ may be hydrogen and $R^3$ may be methyl or phenyl.

The number of hydroxymethyl or substituted hydroxymethyl groups (n in Formula I) on the ring system of formula I ranges from 1 to 10. The number may be limited to fewer than 2, and, if desired, further limited to 1.

Examples of hydroxymethyl compounds that are useful in the compositions of the present invention include piperonyl alcohol, 9-anthracenemethanol, 9-fluorenemethanol, 1-pyrenemethanol, 3-perylenemethanol and the compounds shown below.

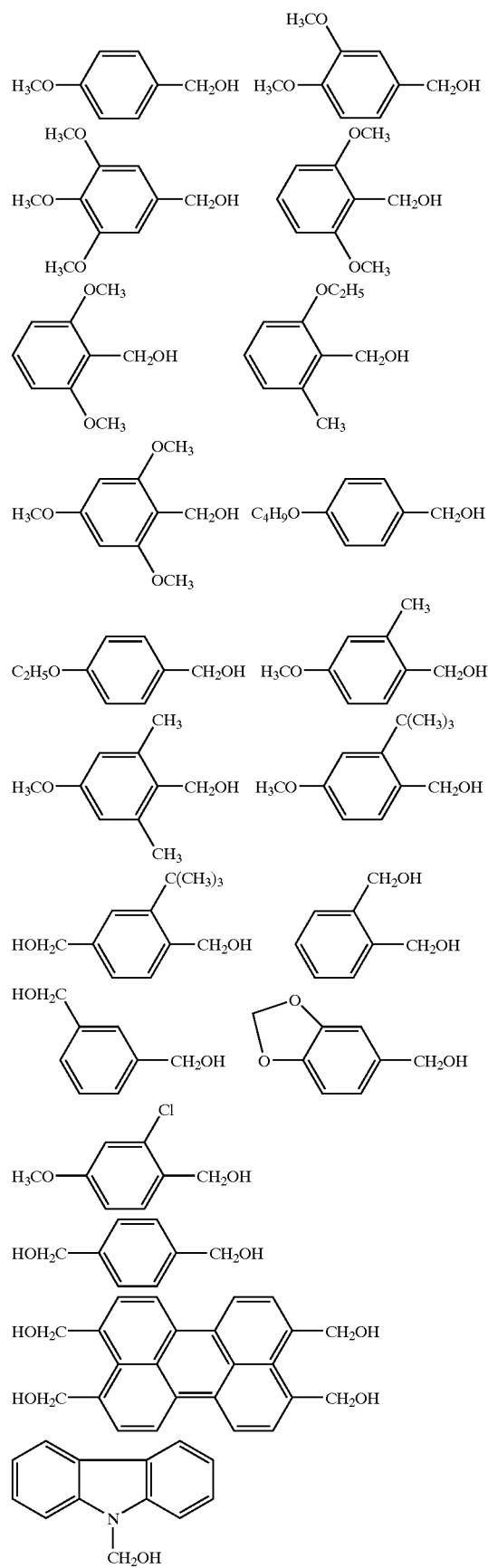

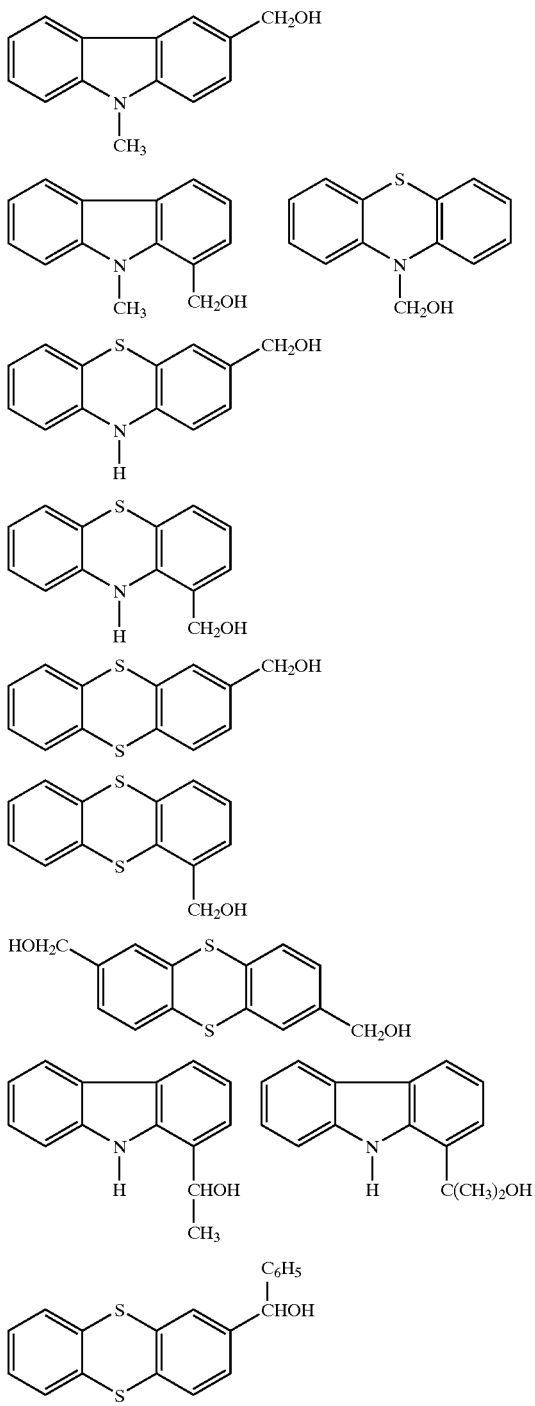

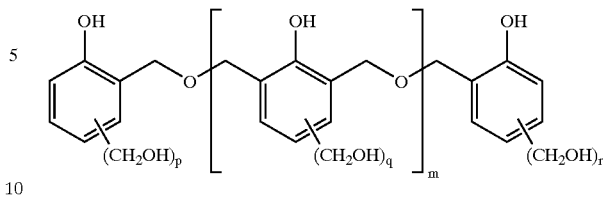

Phenolic resoles may be used as the photosensitizer or polymerization accelerator in the compositions and processes of the present invention. Phenolic resoles are produced by the condensation of phenol with excess formaldehyde in the presence of base to produce low molecular weight condensates that contain a high degree of methylol substitution on the aromatic rings. Formula II shows an example of a resole, where m ranges from 0 to 12, and p, q and r independently range from 0 to 3.

As shown in the formula, the number and position of methyol groups on the rings may vary. Phenolic resoles suitable for use in the present invention typically include materials having a range of molecular weights and degree of methylol substitution. These are commercially available from Durez Corporation of Dallas, Tex., as Methylon resins.

Typically, the photosensitizer is employed in a concentration ranging from 0.01 to 50 mol % based on monomer. The amount of photosensitizer may be limited to 0.01 to 10 mol % based on monomer, and even further limited to 0.01 to 2 mol % based on monomer. The photosensitizer is typically used in an amount corresponding to about 10–50% of the photoinitiator weight, although these amounts and proportions may be varied, if desired.

It is believed that the photosensitizers are effective in accelerating the rates of photoinitiated cationic ring-opening epoxide and oxetane polymerizations because the hydroxymethyl groups can participate in the cationic polymerization reaction and in the free radical chain-induced decomposition of the onium salt photoinitiator. In addition, photosensitzers may be incorporated in the polymer as ether groups at the chain ends. This is advantageous in that the photosensitizer cannot migrate once polymerization is complete. This has important consequences for mitigating toxic effects of these agents.

The cationically photopolymerizable compositions of the present invention also include at least one epoxy resin. A wide variety of cationically polymerizable epoxy resins may be used in the compositions of the present invention. These include cycloaliphatic epoxy resins such as 3,4-epoxycyclohexyl 3',4'-epoxycyclohexane carboxylate (EECH or ERL), bis(3,4-epoxycyclohexyl) adipate, 4-vinylcyclohexene dioxide, limonene dioxide, vinylcyclohexene dioxide and dicyclopentadiene dioxide; α-olefin epoxides such as 1,2-epoxytetradecane, 1,2-epoxydecane, 1,2-epoxydodecane; glycidyl ethers including bisphenol-A diglycidyl ether (BPADGE), bisphenol-F diglycidyl ether, their extended chain analogs, and 1,4-butanediol diglycidyl ether; brominated epoxy resins such as diglycidyl ethers of tetrabromo-bisphenol-A; epoxy cresol novolacs; epoxy phenol novolacs; epoxidized vegetable oils such as epoxidized soybean oil and epoxidized linseed oil; and glycidyl ester resins, as for example, diglycidyl phthalate. The above listed epoxy resins may be included alone or combined to make epoxy mixtures for use in cationically photopolymerizable compositions. In particular, BPADGE, 4-vinylcyclohexene dioxide, limonene dioxide, 3,4-epoxycyclohexyl 3',4'-epoxycyclohexane carboxylate, cyclohexene oxide, or mixtures thereof, may be used.

The cationically photopolymerizable compositions of the present invention also include a cationic photoinitiator. Any of the many compounds known to initiate polymerization by a cationic mechanism may be used. These include, for example, diaryliodonium salts, triarylsulfonium salts, diaryliodosonium salts, dialkylphenylsulfonium salts, dialkyl (hydroxydialkylphenyl)sulfonium salts and ferrocenium salts. Such salts may be modified by the attachment of alkyl, alkoxy, siloxy and the like groups without decreasing their utility. Particularly useful initiators include (4-n-decyloxyphenyl) phenyliodonium hexafluoroantimonate (IOC10), (4-n-decyloxyphenyl)diphenylsulfonium hexafluoroantimonate (SOC10) and S-methyl-S-n-dodecylphenacylsulfonium hexafluoroantimonate (DPS-$C_1C_{12}$). Typically, the photoinitiator is employed in concentrations ranging from 0.01 to 1.0 mol % based on monomer, or 0.1 to 10% by weight based on the total monomer weight.

EXAMPLES

Following are examples used to illustrate the compositions and processes of the present invention in further detail.

Materials

The benzyl alcohols, 2-phenylethanol, 9-fluorenemethanol, 9-anthracenemethanol, 2-chloroethylvinyl ether, cyclohexene oxide and 4-vinylcyclohexene dioxide (VCHDO) were used as purchased from the Aldrich Chemical Co. (Milwaukee, Wis.) Co. (Blooming Prairie, Minn.). 3,4-Epoxycyclohexyl methyl 3',4'-epoxycyclohexancarboxylate (ERL-4221E, ERL) was purchased from the Union Carbide Corp. (Bound Brook, N.J.). Bisphenol-A diglycidyl ether (BPADGE) was obtained from the Dow Chemical Co. (Midland, Mich.). Onium salt cationic photoinitiators, (4-n-decyloxyphenyl) phenyliodonium hexafluoroantimonate (IOC10), (4-n-decyloxyphenyl)diphenylsulfonium hexafluoroantimonate (SOC10) and S-methyl-S-n-dodecylphenacylsulfonium hexafluoroantimonate (DPS-$C_1C_{12}$) were prepared as described in the following references: IOC-10—Crivello, J. V.; Lee, J. L. *J. Polym. Sci. Part A: Polym. Chem. Ed.* 1989, 27, 3951, SOC10—Akhtar, S. R.; Crivello, J. V.; Lee, J. L. *J. Org. Chem.* 1990, 55, 4222 and DPS-$C_1C_{12}$—Crivello, J. V.; Kong, S *Macromolecules* 2000, 33, 833. The structures of the respective monomers and photoinitiators are shown in Table 1. $^1$H NMR spectra were obtained using a Varian XL 500 MHz spectrometer at room temperature in $CDCl_3$ using tetramethylsilane as an internal standard.

TABLE 1

Structures of Photoinitiators and Monomers

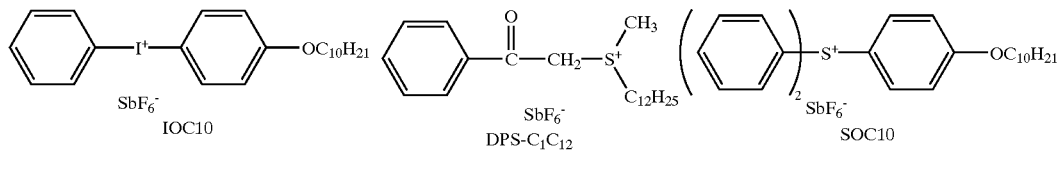

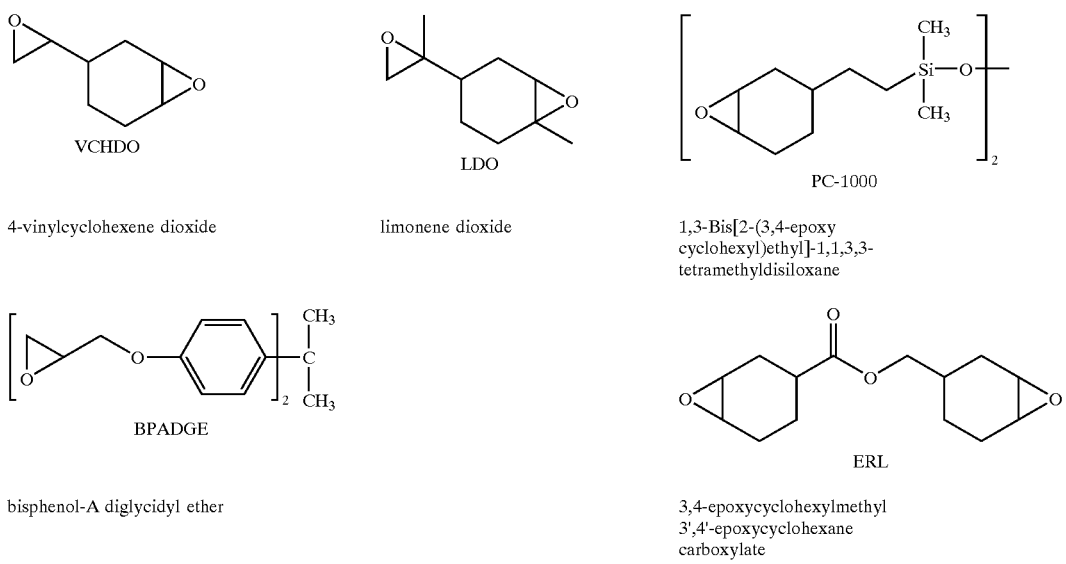

unless otherwise noted. PC-1000 was supplied by the Polyset Co. (Mechanicville, N.Y.). Bis(3-ethyl-3-oxetanylmethyl)ether was kindly supplied by Toagosei Chemical Company, LTD (Nagoya, Japan). Limonene dioxide (LDO) was obtained as a gift from the Witco Chemical Preparation of 3-perylenemethanol and 1-pyrenemethanol To a 250-mL three-necked round bottom flask containing N-methylformanilide (11.0 g, 0.081 mol) and freshly distilled o-dichlorobenzene (20 mL) was added phosphorus oxychloride (11.0 g, 0.072 mol). The mixture was stirred at room temperature under $N_2$ for 15 min. Perylene (8.8 g, 0.035 mol) was added into the flask and the reaction mixture stirred at 80–85° C. under $N_2$ atmosphere for 18 h. A concentrated aqueous solution of sodium acetate (50 g) was added and then stirred for 2 h. The mixture was extracted with dichloromethane (10×200 mL). The extractions were combined, washed with distilled water (4×500 mL), and then dried over anhydrous sodium sulfate. The dried intensely violet colored solution was concentrated to about 200 mL and left on the bench overnight. A yellow-brown crystalline solid (6.5 g) was obtained. The mother liquor was concentrated to give an additional 2.0 g of perylenecarboxaldehyde, melting point: 232–4° C. (lit. 236° C.). (Buu-Hoi, N. P. and Long, C. T. Rec. Trav. chim. 1956, 75, 1221).

$^1$H NMR δ(CDCl$_3$): 10.29 (s, 1H), 9.14 (d, J=8.5 Hz, 1H), 8.3–8.20 (m, 4H) 7.8 Hz, 1H), 7.83 (d, J=8.1 Hz, 1H), 7.73 (d, J=8.1 Hz, 1H), 7.66 (t, J=7.7 Hz, (m, 2H).

A 250-mL three-necked round bottom flask was charged 3-perylenecarboxaldehyde (3.0 g, 0.011 mol), sodium borohydride (2.2 g, 0.058 mol) and dried THF (60 mL). The mixture was stirred at 80° C. (oil bath) under $N_2$ atmosphere for 15 h. The flask was cooled in an ice-water bath and 1 M HCl solution slowly added until no reaction observed (~50 mL). After extracting the mixture with dichloromethane (4×300 mL), the extractions were combined, washed with 3% Na$_2$CO$_3$ (100 mL), distilled water (4×400 mL), and then dried over anhydrous sodium sulfate. The dried red solution was concentrated to about 50 mL and cooled in the freezer overnight. A brown solid (2.3 g) was obtained having a melting point of 207–209° C.

$^1$H NMR δ(CDCl$_3$): 8.20(d, J=7.6 Hz, 1H), 8.17 (d, J=7.5 Hz, 2H), 8.12 (d, J=7.8 Hz, 1H), 7.92 (d, J=8.3 Hz, 1H), 7.68 (d, J=8.1 Hz, 2H), 7.56–7.44 (m, 4H), 5.07 (d, J=5.6 Hz, 2H), 1.76 (t, J=5.8 Hz, 1H).

In a similar manner, 1-pyrenecarboxaldehyde was prepared using the method of Buckley, et al. (Buckley, D. A.; Thomas, H. R. Ger. Offen. 1975 DE 2456538 19750710; U.S. Appl. 73-428929; Chem. Abstr. 1975, 83, P192946w) and employing N-methylformanilide instead of N-methylformamide. There were obtained after reduction with sodium borohydride 1-pyrenemethanol, m.p. 122–124° C. (lit. m.p. 125–126). The $^1$H NMR spectrum of this compound corresponded in all respects with a sample obtained from the Aldrich Chemical Company.

Table 2 shows the structures, melting points and UV spectral characteristics of these compounds.

TABLE 2

Structures and Spectral Characteristics of Hydroxymethylated Polynuclear Aromatic Hydrocarbons[a]

| Photosensitizer | m.p. (° C.) | λ$_{max}$ (nm) | ε | Reference |
|---|---|---|---|---|
| 9-anthracenemethanol | 162–164[c] | 247<br>322.5<br>338.5<br>357<br>376.5 | 146600<br>2890<br>5650<br>8330<br>7840 | Sadler Standard Spectra, Vol. 1, Spectrum No. 24308, Sadtler Research Laboratories, Inc., Philadelphia, PA, 1970 |
| 9-fluorenemethanol | 105–107[c] | 220.5<br>228<br>265<br>289<br>300 | 16800<br>6670<br>19600<br>5490<br>7100 | Sadler Standard Spectra, Vol. 1, Spectrum No. 24308, Sadtler Research Laboratories, Inc., Philadelphia, PA, 1970 |
| pyrene | 149–151[c] | 230.5<br>239.5<br>251<br>261<br>271<br>294<br>305<br>318<br>333.5 | 43400<br>85100<br>11800<br>24400<br>49800<br>2680<br>6910<br>17600<br>29400 | Sadler Standard Spectra, Vol. 1, Spectrum No. 24308, Sadtler Research Laboratories, Inc., Philadelphia, PA, 1970 |

TABLE 2-continued

Structures and Spectral Characteristics of Hydroxymethylated
Polynuclear Aromatic Hydrocarbons[a]

| Photosensitizer | m.p. (° C.) | $\lambda_{max}$ (nm) | $\epsilon$ | Reference |
|---|---|---|---|---|
| 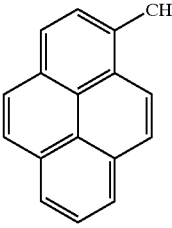  1-pyrenemethanol | 122–124 123–126[c] | 234 243 255 265 313 327 343 | 49430 79880 14470 31090 56700 32100 47030 | Buckley, D. A.; et al., Chem. Abstr. 1975, 83, P192946w de Clercq; Martin, R. H. Bull. Soc. Chim. Belges. 1955, 64 367. |
| 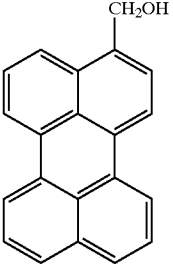  3-perylenemethanol | 207–209 | 211[b] 255 392 414 441 | 72880 43420 13300 28180 36780 | |

[a]Measured in methanol.
[b]Measured in THF.
[c]Aldrich Handbook of Fine Chemicals and Laboratory Equipment, 2000–2001.

In general, the melting points of the hydroxymethylated compounds that appear in this table are lower than their corresponding parent hydrocarbon precursors and this is also indicative of the enhanced solubility of these former compounds. It is interesting to note that these compounds have UV absorption characteristics that are similar to their parent hydrocarbons (perylene is included in this table as an example) and that they provide a large number of bands with appreciable molar extinction coefficients in the long wavelength and visible regions. It may further be observed that as the number of aromatic rings in a polynuclear hydrocarbon increases, these absorption bands shift to longer wavelengths.

Photopolymerization of Cyclohexene Oxide

To confirm that the hydroxymethylated polynuclear hydrocarbon photosensitizers were incorporated into the polymers that are formed, the bulk polymerization of cyclohexene oxide was carried out using IOC10 and 1-pyrenemethanol, respectively as the photoinitiator and photosensitizer. Into a dry vial were placed 2.0 g (0.02 mol) cyclohexene oxide in which was dissolved 0.1 mol % IOC10 and 0.1 g (0.0004 mol, 2.0 mol %) 1-pyrenemethanol. The mixture was degassed using a stream of nitrogen and sealed with a rubber septum. Irradiation of the sample was conducted for 10 minutes at room temperature in a Rayonet Ultraviolet Irradiator equipped with 16 lamps with an emission centered at 300 nm. Then, the semisolid polymer was dissolved in dichloromethane containing a drop of triethylamine and then precipitated into methanol. This process was repeated two more times to ensure removal of small molecule starting materials and products. Finally, the polymer was dried overnight in a vacuum oven, dissolved in THF and the UV spectrum recorded. The presence of the strong, prominent absorption bands in the spectrum at 243, 265, 276, 314, 327 and 343 nm are indicative of the incorporation of the photosensitizer into the polymer backbones.

Studies of the Rates of Photoinitiated Ring-Opening Cationic Epoxide Polymerization by Fourier Transform Real-Time IR Spectroscopy (FT-RTIR)

The kinetics of the direct and photosensitized cationic photopolymerizations of various epoxy monomers were monitored using FT-RTIR spectroscopy. A Midac M-1300 FT-IR spectrometer equipped with a liquid nitrogen-cooled Hg—Cd—Te detector was fitted with a UVEX Model SCU-110 mercury lamp in which the light is carried through a flexible wand to the sample compartment. The end of the wand was placed at a predetermined distance and directed at an incident angle of 45° onto the sample window. The intensity of UV irradiation was measured with a UV Process Supply Inc Control Cure Radiometer. All kinetic experiments in this investigation were conducted at 25° C. at such light intensities as to permit a convenient monitoring and analysis of the data.

Samples for kinetic analysis were prepared as follows: a homogeneous solution of the subject monomer with the designated photoinitiator and photosensitizer was prepared (all concentrations are given in mol % with respect to the monomer unless otherwise noted). The solutions were spread as thin films between two layers of 12 $\mu$m corona treated oriented polypropylene film and then mounted in 2 cm×2 cm plastic slide holders. The reproducibility of the sample thickness between various samples was checked by monitoring the peak-to-peak distance taken by the interferometer. During the photopolymerization, the infrared absorption band at 789 cm$^{-1}$ due to the epoxy group was monitored. Data were collected at a rate of one spectrum per second. Then, the spectral data were converted to conversion versus time curves and plotted using Midac Grams/386 software.

The kinetic parameter, $R_p/[M_o]$, for selected kinetic runs was determined from the slopes of the initial, linear portions of the irradiation time-conversion curves according to the following equation:

$$R_p/[M_o] = ([conversion]_{t2} - [conversion]_{t1})/(t_2 - t_1)$$

where $R_p$ and $[M_o]$ are respectively the rate of polymerization and the initial monomer concentration and the conversions are as determined from the curves at irradiation times $t_1$ and $t_2$.

In FIG. 1 are shown the results of a study of the influence of the inclusion of various amounts of benzyl alcohol (BzOH) in the polymerization of the difunctional epoxy monomer, 4-vinylcyclohexene dioxide (VCHDO). As the amount of benzyl alcohol is increased, the rates of the photopolymerization as indicated by the slope of the conversion versus time curves increase. The rate increase is maximized when between 30–40 mol % (based on epoxy monomer) benzyl alcohol is added. It should also be noted that the conversion of epoxide groups increases as the amount of benzyl alcohol increases.

Figure 2:
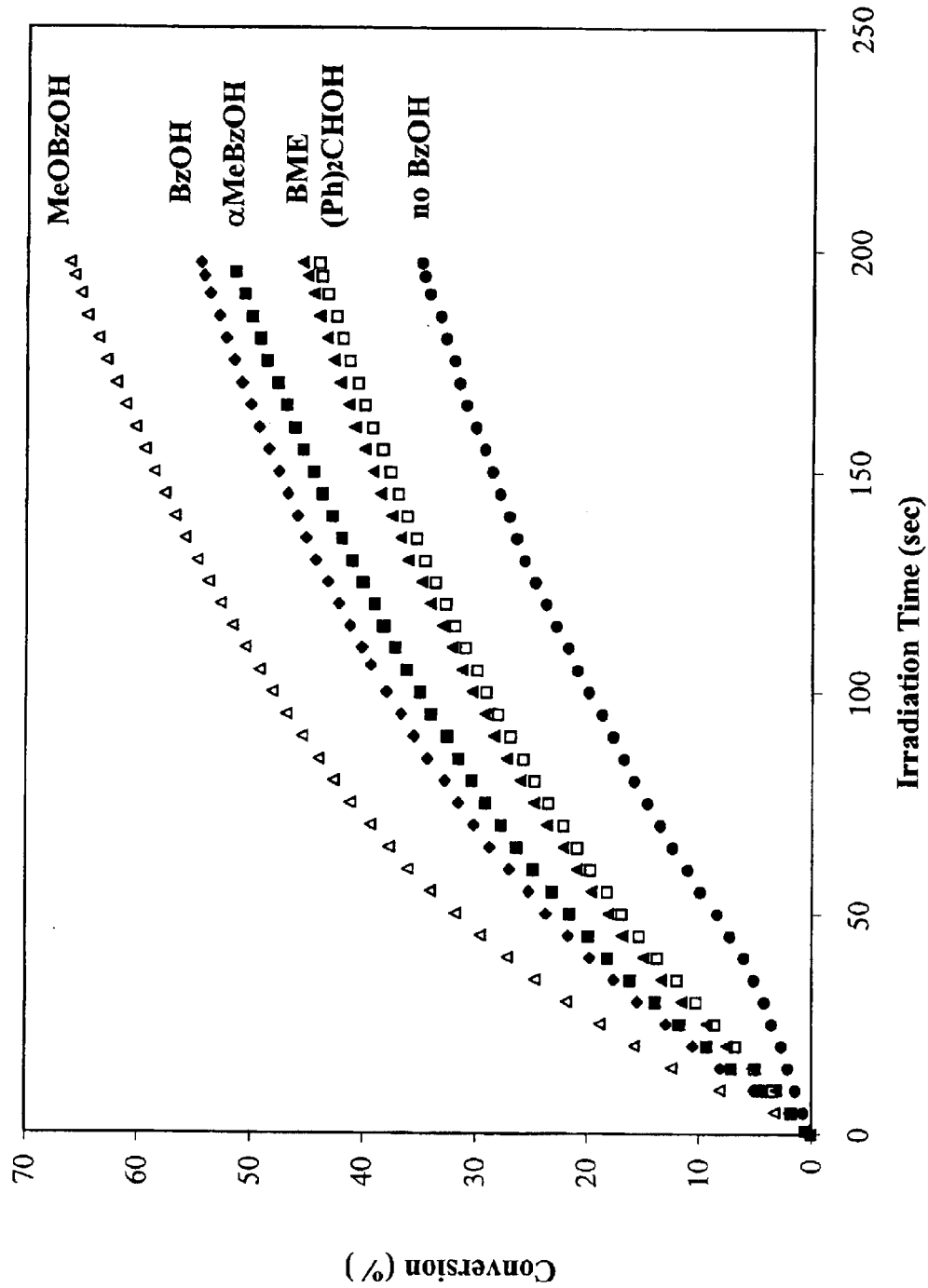
FIG. 2.—Comparison of the accelerating effects of 20% various benzyl alcohols on the cationic ring-opening photopolyinerization of VCHDO (photoinitiator, 0.1% IOC10; light intensity 150 mJ/cm$^2$min).

FIG. 2 shows a comparison of the effects of 20% of various benzylic alcohols on the photopolymerization of VCHDO. A curve in which no benzyl alcohol was used is included as a baseline. Also shown in this figure is a study of the polymerization conducted in the presence of benzyl methyl ether. Benzyl methyl ether (BME) does have a slight accelerating effect on the polymerization rate despite the fact that it does not possess a hydroxyl group. We ascribe this effect to the ability of this compound to participate in the free radical chain induced decomposition of the photoinitiator. Diphenylmethanol (benzhydrol, Ph$_2$CHOH) also has a weak accelerating effect on the photopolyinerization. In this case, despite the greater anticipated stabilizing effect of the diphenylmethyl group on the radical and cationic intermediates, this alcohol is much more sterically hindered and undergoes slow reaction with the initiating and propagating oxonium ions. A similar rationale accounts for the slightly better behavior of α-methylbenzyl alcohol (α-MeBzOH). 4-Methoxybenzyl alcohol (MeOBzOH) shows the greatest accelerating effect on the photopolymerization of VCHDO. This is ascribed to the presence of the 4-methoxy group in the molecule which provides resonance and inductive stabilization for both radical and cationic intermediates. In addition, the presence of the methoxy group would also be expected to increase the nucleophilicity of the benzyl alcohol resulting in an enhanced ability of this compound to participate in an activated monomer mechanism.

Figure 3:
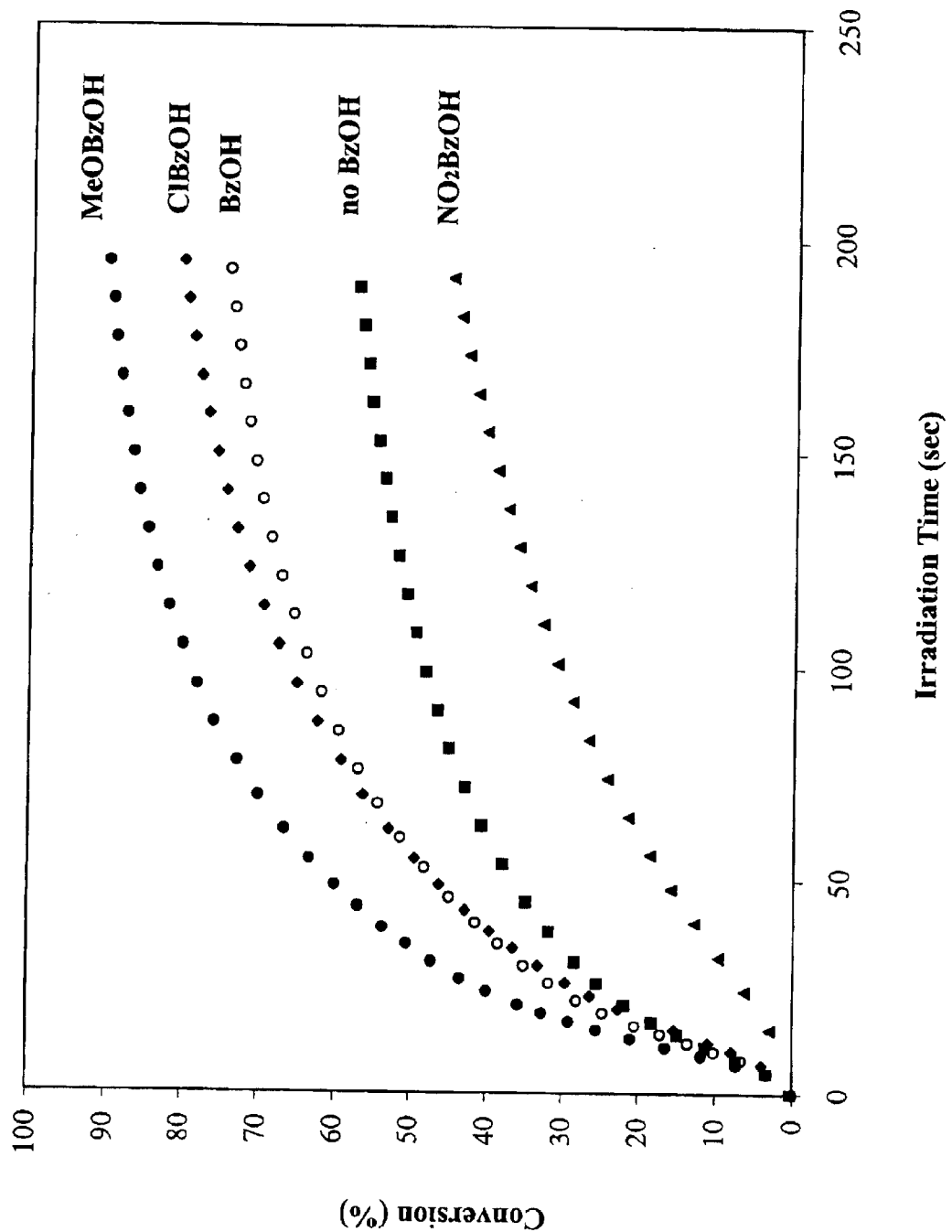
FIG. 3.—Comparison of the effects of 20% various benzyl alcohols on the cationic ring-opening photopolymerization of VCHDO (photoinitiator, 1.0% IOC10; light intensity 190 mJ/cm²min).

FIG. 3 shows a further comparison between benzyl alcohols bearing electron donating and electron withdrawing substituents. The results of these kinetic studies are summarized in Table 3.

TABLE 3

Kinetic Parameters for the Cationic Photopolymerization of Difunctional Epoxide Monomers in the Presence of Benzyl Alcohols

| Monomer | IOC10 (mol %) | Benzyl Alcohol† | UV Intensity (mJ/cm$^2$min) | $R_p/[M_o]$ (10$^{-2}$ s$^{-1}$) | AF* | Conversion‡ |
|---|---|---|---|---|---|---|
| VCHDO | 1.0 | — | 190 | 1.2 | — | 57 |
| VCHDO | 1.0 | benzyl | 190 | 1.5 | 1.3 | 74 |
| VCHDO | 1.0 | 4-methoxybenzyl | 190 | 2.2 | 1.9 | 90 |
| VCHDO | 1.0 | 3,5-dimethoxybenzyl | 190 | 1.8 | 1.5 | 78 |
| VCHDO | 1.0 | 3,4-dimethoxybenzyl | 190 | 6.1 | 5.3 | 95 |
| VCHDO | 1.0 | piperonyl | 190 | 5.8 | 5.0 | 95 |
| VCHDO | 1.0 | 4-nitrobenzyl | 190 | 0.33 | 0.29 | 45 |
| VCHDO | 1.0 | 4-chlorobenzyl | 190 | 1.4 | 1.2 | 80 |
| LDO | 0.25 | — | 175 | 1.7 | — | 67 |
| LDO | 0.25 | piperonyl | 175 | 14.5 | 8.5 | 95 |
| PC-1000 | 1.0 | — | 175 | 3.3 | — | 81 |
| PC-1000 | 1.0 | piperonyl | 175 | 12 | 3.5 | 95 |
| ERL | 1.0 | — | 175 | 0.48 | — | 14 |
| ERL | 1.0 | piperonyl | 175 | 12 | 24 | 54 |
| BPADGE | 1.0 | — | 175 | 0.19 | — | 28 |
| BPADGE | 1.0 | piperonyl | 175 | 0.70 | 3.7 | 59 |

†20 mol %
*Rate acceleration factor AF = $R_p[M_o]_{alcohol}/R_p[M_o]$
‡Conversion after 200 sec. UV irradiation.

Figure 4:
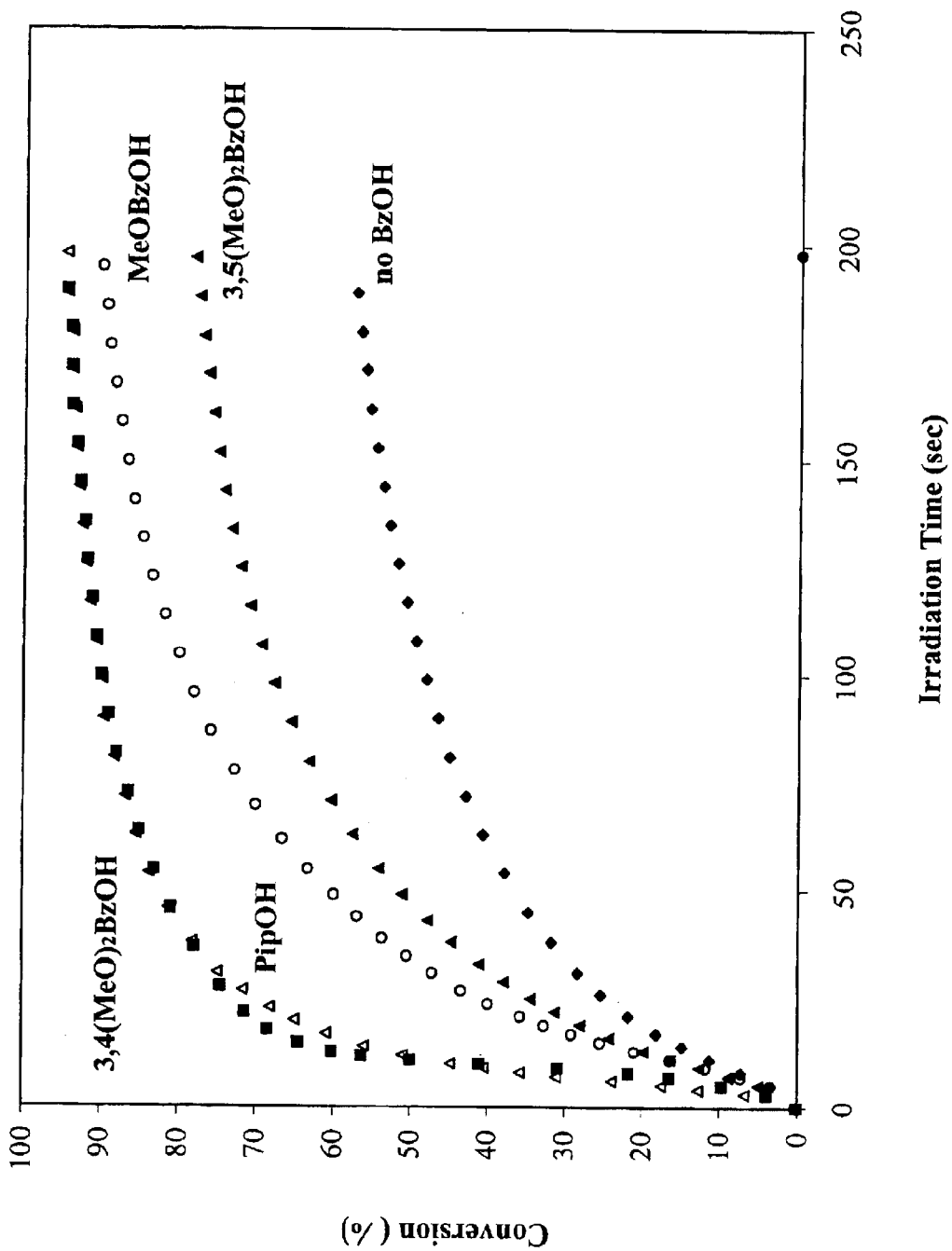
FIG. 4.—Comparison of the accelerating effects of 20% various benzyl alcohols bearing electron donating groups on the cationic ring-opening photopolymerization of VCHDO (photoinitiator, 1.0% IOC10; light intensity 190 mJ/cm²min).

In addition to the rates for the various substituted and unsubstituted benzyl alcohols, there is included in Table 3 the rate determined in the absence of an alcohol. Using these values, we have determined an acceleration factor, AF, for each benzylic alcohol, where AF is the ratio of the rates of epoxide ring-opening polymerization in the presence of the benzyl alcohol versus the rate in its absence: AF=$R_p/[M_o]_{alcohol}/R_p/[M_o]$ 4-Nitrobenzyl alcohol (NO$_2$BzOH) had a pronounced decelerating effect (AF=0.29) on the photopolymerization of VCHDO, while 4-chlorobenzyl alcohol (ClBzOH) has approximately the same activity (AF=1.2) as benzyl alcohol (AF=1.3). Both of these benzyl alcohols are considerably less reactive as compared to 4-methoxybenzyl alcohol (AF=1.9) in accelerating the photopolymerization. Reactivity of substituent having electron donating character is shown in FIG. 4. 3,5-Dimethoxybenzyl alcohol (3,5(MeO)$_2$BzOH), in which only the inductive effects of the two methoxy groups are felt by the benzylic group, is more reactive (AF=1.5)

than the unsubstituted benzyl alcohol. In contrast, 3,4-dimethoxybenzyl alcohol (3,4(MeO)$_2$BzOH) exhibits a very strong accelerating effect (AF=5.3) on the photopolymerization of VCHDO and this alcohol is a much better accelerator than 4-methoxybenzyl alcohol. Also shown in FIG. 4 is a conversion versus time curve for piperonyl alcohol (3,4-methylenedioxyphenylmethanol, PipOH). Piperonyl alcohol is a readily available benzylic alcohol derived from the natural product, saffrole (Fuson, R. C. *Reactions of Organic Compounds*, John Wiley & Sons, New York, 1962, p. 230; *The Merck Index*; 9$^{th}$ Ed., Windholz, M.; Budavari, editor, Merck & Co., Inc., Rahway, N.J., 1975, p. 973).

Figure 5:
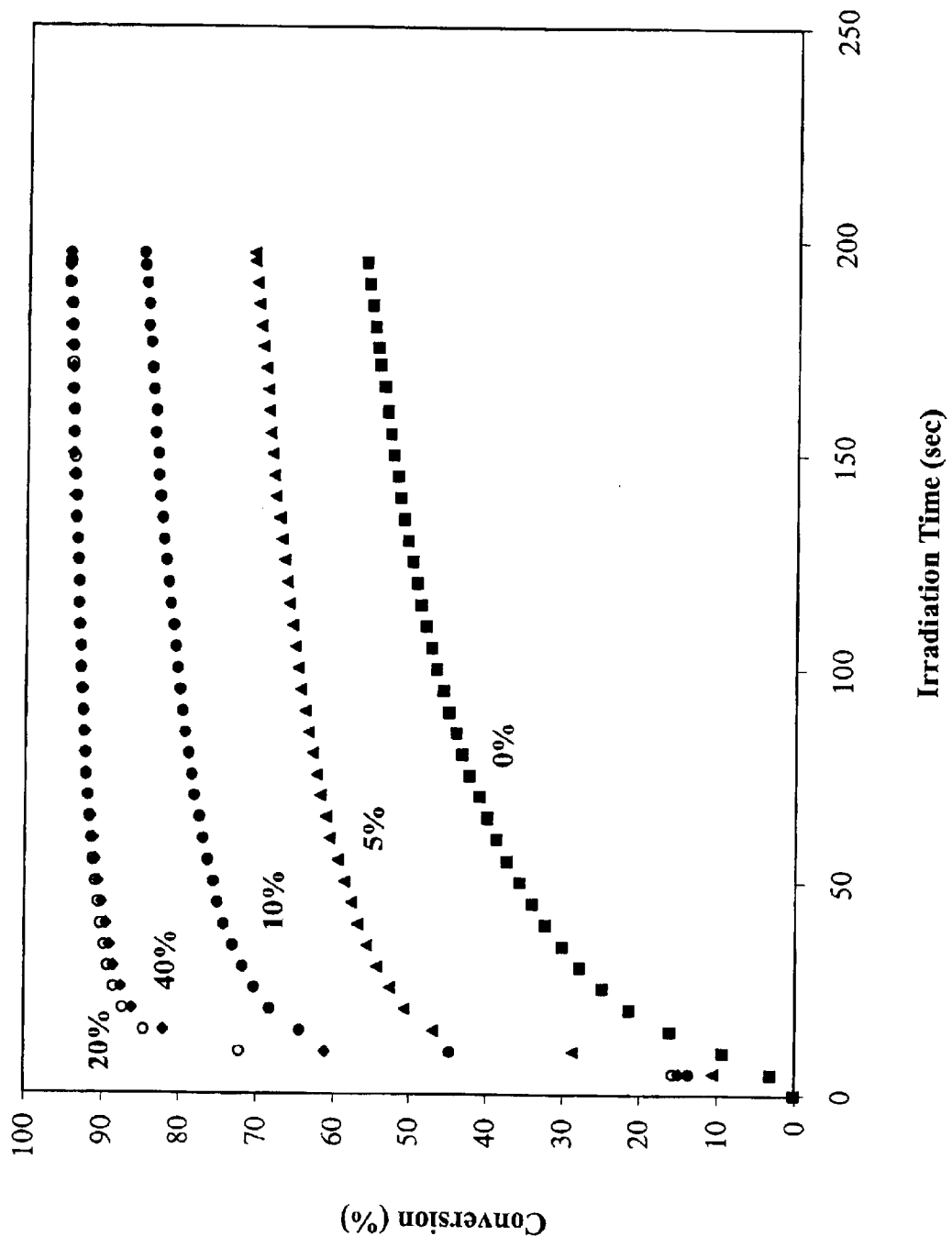
FIG. 5.—Effect of the concentration of piperonyl alcohol on the photopolymerization of VCHDO in the presence of 1.0% IOC10 (light intensity 250 mJ/cm²min).

Piperonyl alcohol contains a highly electron-rich and activating methylenedioxy group on the benzene ring. Piperonyl alcohol is equally efficient as an accelerator (AF=5.0) for the polymerization of VCHDO as 3,4-dimethoxybenzyl alcohol and is far more readily available and inexpensive. A study to determine the optimal concentration of piperonyl alcohol for the polymerization of VCHDO is shown in FIG. 5. Excellent rate acceleration and also an appreciable increase in the conversion are observed when only 5% of the alcohol is included in the polymerization mixture. These two effects are maximized at 20% of piperonyl alcohol.

Figure 6:
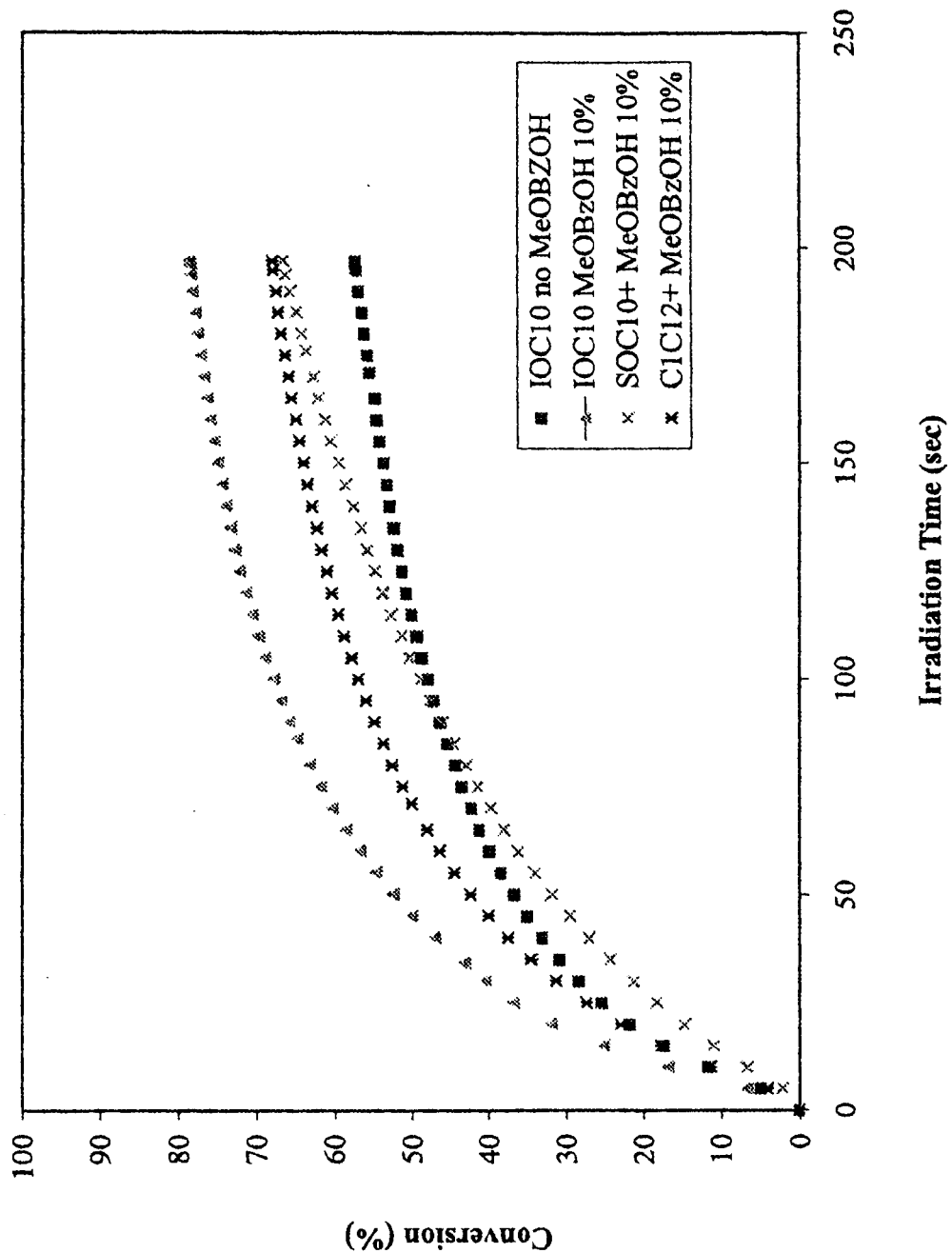
FIG. 6.—FT-RTIR study of the cationic photopolymerizations of VCHDO in the presence of 10% 4-methoxybenzyl alcohol (■) and with 5% nitrobenzene added (▲) (photoinitiator, 1.0% IOC10; light intensity 200 mJ/cm²min).

In an attempt to distinguish between the contributions of free radical and ionic mechanisms, the polymerization of VCHDO carried out in the presence of 10% 4-methoxybenzyl alcohol was compared alone and in the presence of nitrobenzene as a free radical retarder. The results are given in FIG. 6. When 5 mol % of nitrobenzene is added to the polymerization mixture, there was a substantial retardation of the polymerization rate. Comparing the rate factors for polymerization (R$_p$[M$_o$]) in the absence of an alcohol (0.92), with 4-methoxybenzyl alcohol (1.9) and for a mixture containing both 4-methoxybenzyl alcohol and nitrobenzene (0.99), it can be seen that most of the acceleration is due to the contribution of the free radical mechanism to the overall observed acceleration of the rate of polymerization of VCHDO.

Figure 7:
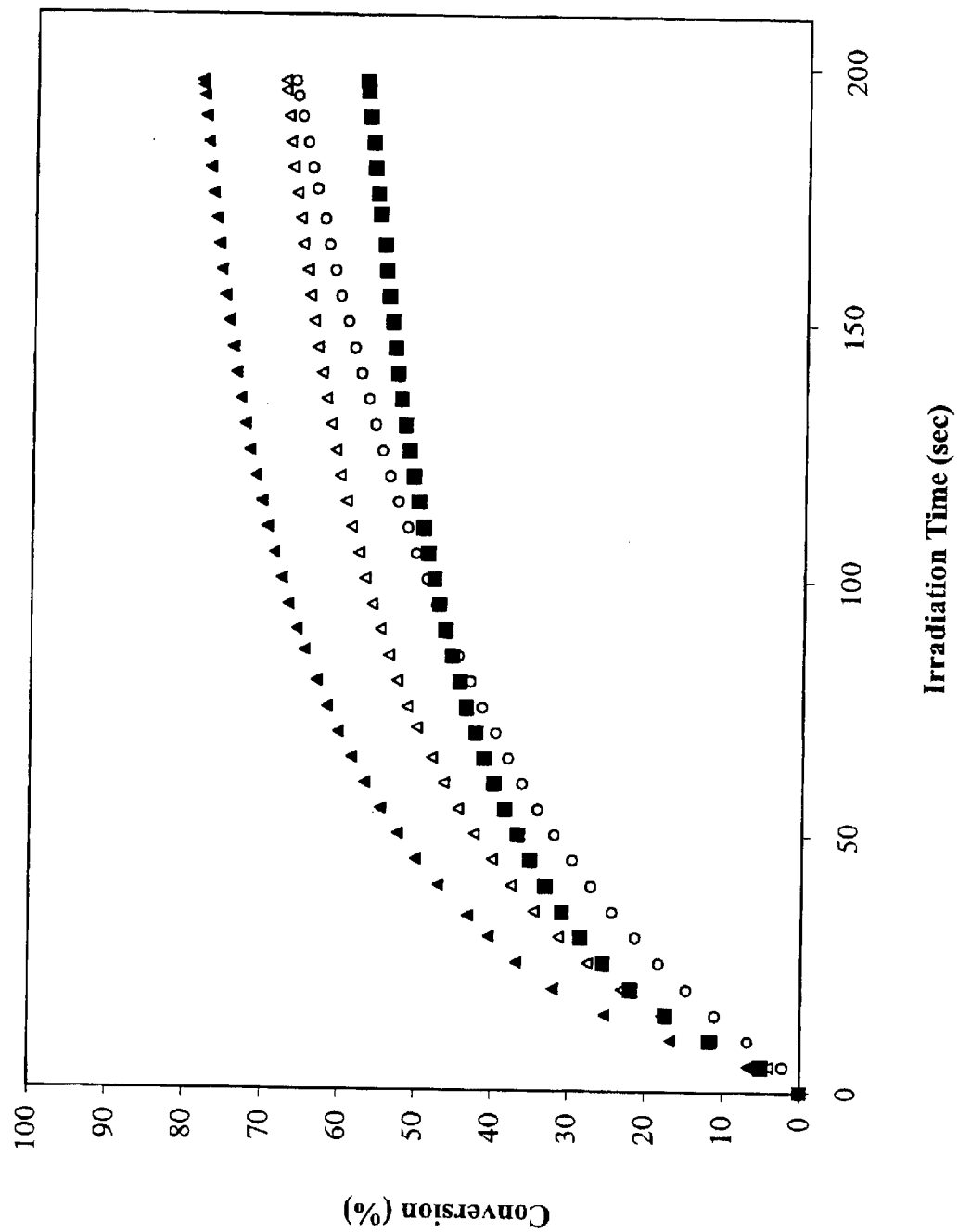
FIG. 7.—The effect of the photoinitiator on the photopolymerization of VCHDO in the presence of 10% 4-methoxybenzyl alcohol (1.0% IOC10, (▲) SOC10 (○) DPS-$C_1C_{12}$ (Δ)IOC10 no alcohol, (■) (light intensity 200 mJ/cm²min)).

FIG. 7 shows the effect of the structure of the photoinitiator on the photopolyinerization of VCHDO using 4-methoxybenzyl alcohol as an accelerator. Again, a study in which no alcohol was used is included for comparison. There was a significant rate enhancement only in the case in which the diaryliodonium salt photoinitiator was employed. Although there is some difference in the absorption characteristics and quantum yields for these three different photoinitiators, the major difference appears to lie in the difference in the oxidation potentials of the onium salts. IOC10 with a lower oxidation potential (E$_{1/2}$=−0.2 V) is more easily reduced than SOC10 (E$_{1/2}$=−1.01 to −1.46 V). The reduction potential of dialkylphenacylsulfonium salts has been found to be intermediate (E$_{1/2}$=−0.7 V) between diaryliodonium and triarylsulfonium salts. These results lend further support to the proposed radical component of the mechanism.

Figure 8:
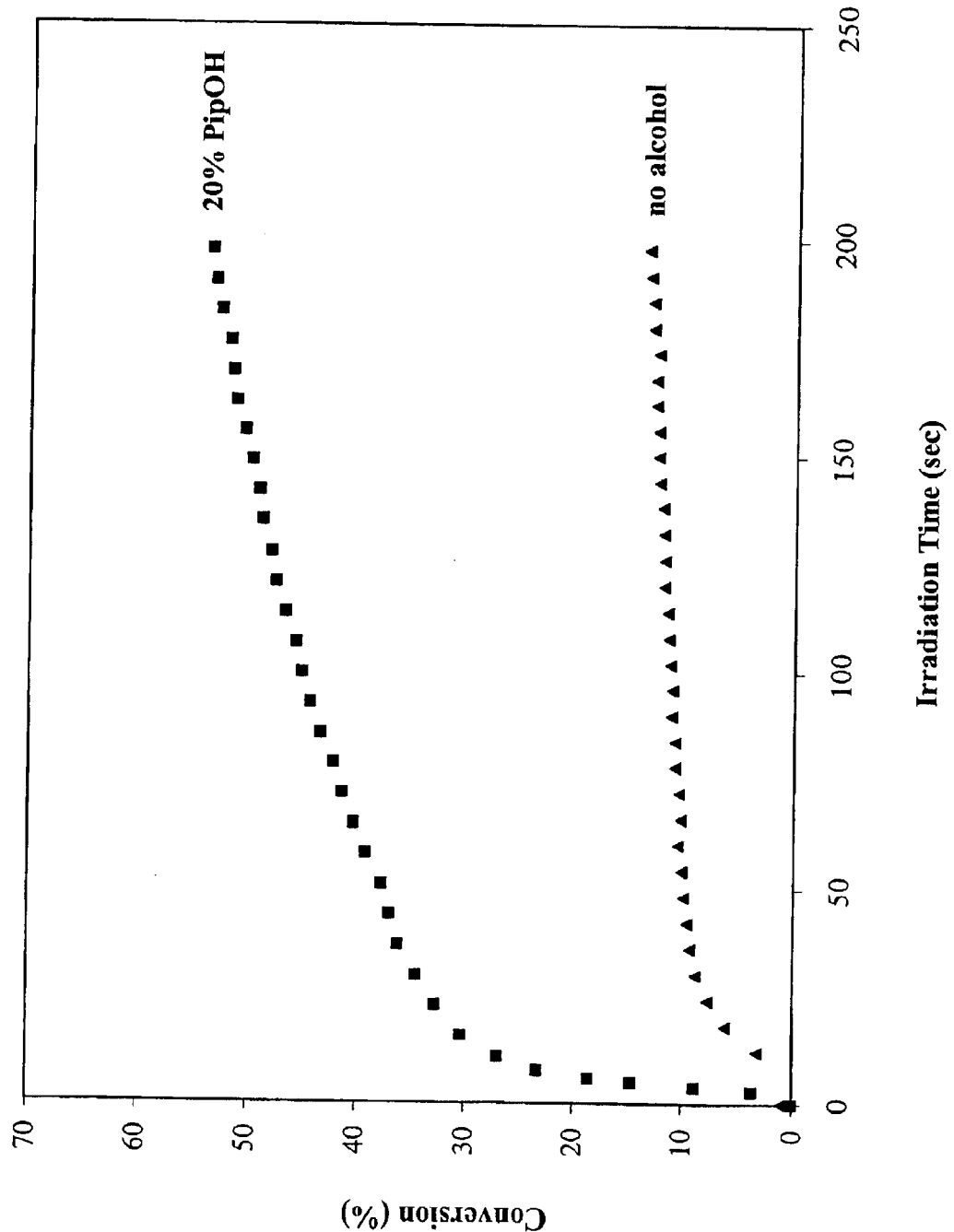
FIG. 8.—Photopolymerization of ERL alone (▲) and in the presence of 20% piperonyl alcohol (■) (light intensity 175 mJ/cm²min; 1.0% IOC10).
Figure 9:
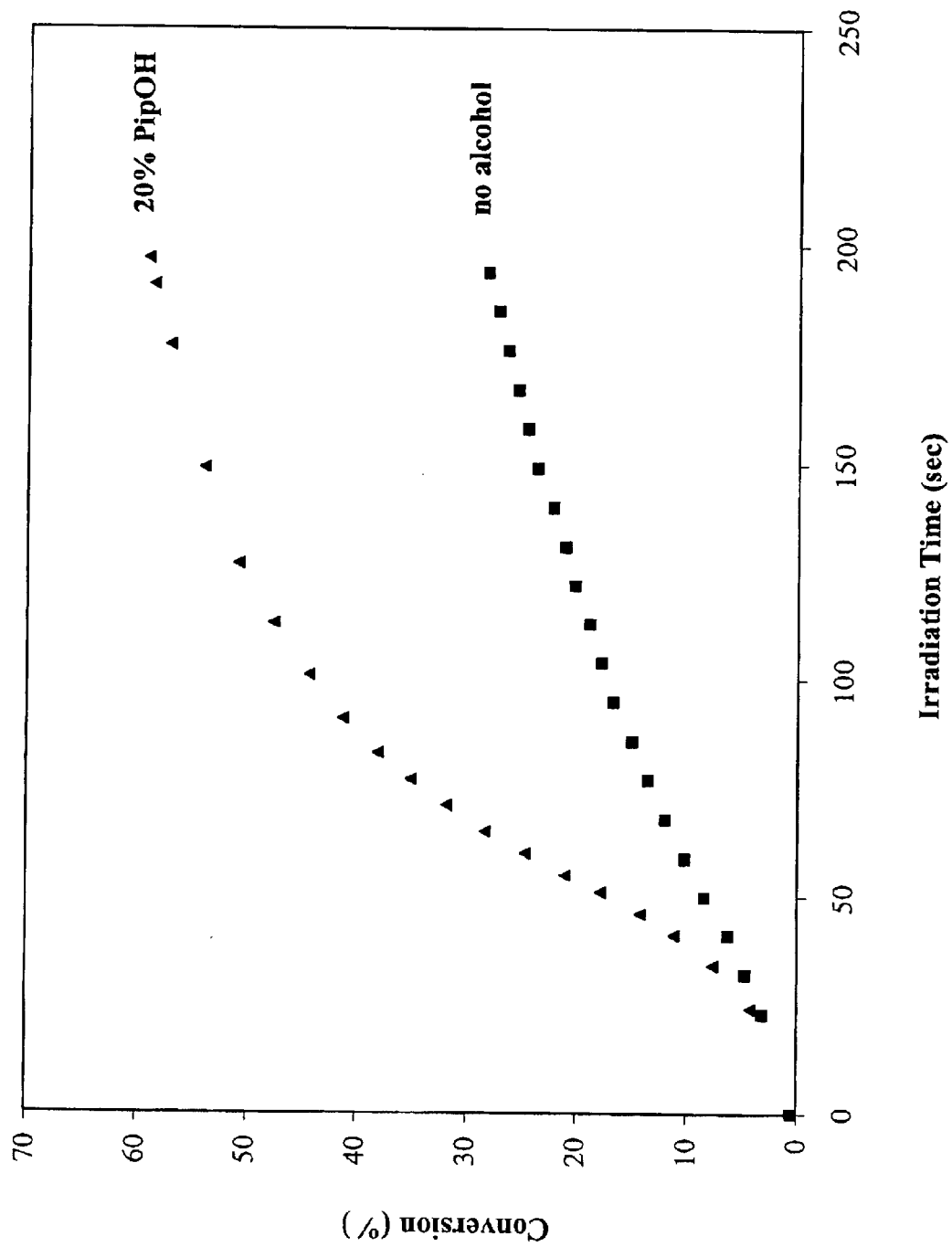
FIG. 9.—Photopolymerization of BPADGE alone (■) and in the presence of 20% piperonyl alcohol (▲) (light intensity 175 mJ/cm²min; 1.0% IOC10).

The effect of hydroxymethyl compounds on the photopolymerizations of epoxide monomers other than VCHDO was also investigated. Accordingly, four very typical but different types of difunctional epoxide monomers with structures shown in Table 1 were photopolymerized in the presence of 20% of piperonyl alcohol and also, for comparison, in its absence. The results of these kinetic studies are also summarized in Table 3. In all cases, substantial increases in both the rate of polymerization and in the conversions are observed. Limonene dioxide exhibits similar, reactivity to VCHDO and also a high acceleration factor (AF=8.5). Difunctional epoxy silicone monomer, PC-1000, also displays excellent acceleration (AF=3.5) in the presence of piperonyl alcohol. FIG. 8 shows the photopolymerization of commercially available 3,4-epoxycyclohexylmethyl 3',4'-epoxycyclohexanecarboxylate (ERL) under the same conditions. A remarkable 24-fold increase in the rate of the photopolymerization of this monomer is observed in the presence of piperonyl alcohol. At the same time, the conversion of epoxy groups after 200 seconds irradiation is increased four-fold. The photopolymerization of bisphenol-A diglycidyl ether (BPADGE) in the presence and absence of piperonyl alcohol is depicted in FIG. 9. This monomer displays very sluggish photopolymerization behavior in the absence of the alcohol. However, when piperonyl alcohol is added, the rate is accelerated by a factor of 3.7 and the conversion after 200 seconds irradiation is essentially doubled.

Hydroxymethylated polynuclear hydrocarbon photosensitizers were also evaluated in cationic ring-opening polymerizations, using a variety of monomers. Kinetic data from the runs is tabulated in Table 4 along with a description of the experimental conditions under which they were obtained.

TABLE 4

Kinetic Data for Photosensitized Polymerizations

| Entry | Monomer | Photosensitizer | Conc. (mol %) | P.I./conc. (mol %) | Light Intens. (mJ/cm$^2$ min) | Rp/[M]$_o$ | AF |
|---|---|---|---|---|---|---|---|
| 1 | VCHDO | 1-pyrenemethanol | 6.7 | IOC10/0.67 | 175 | 13 | 10 |
| 2 | | 9-anthracenemethanol | 6.7 | | | 4.5 | 4.5 |
| 3 | | none | — | | | 1.3 | — |
| 4 | VCHDO | 1-pyrenemethanol | 6.0 | SOC10/0.6 | 180 | 11 | 4.6 |
| 5 | | benzyl alcohol | 6.0 | | | 3.7 | 1.6 |
| 6 | | none | — | | | 2.3 | — |
| 7 | LDO | 1-pyrenemethanol | 6.0 | SOC10/0.6 | 173 | 9.5 | 4.1 |
| 8 | | 9-anthracenemethanol | 6.0 | | | 2.3 | 1.0 |
| 9 | | none | — | | | 2.3 | — |
| 10 | CY179 | 1-pyrenemethanol | 6.0 | SOC10/1.0 | 1250 | 2.0 | 9.0 |
| 11 | | none | — | | | 0.23 | — |
| 12 | VCHDO | 1-pyrenemethanol | 2.0 | IOC10/0.7 | 176 | 15 | 7.0 |
| 13 | | none | — | | | 2.2 | — |
| 14 | VCHDO | 1-pyrenemethanol | 0.5 | IOC10/0.7 | 85 | 8.6 | 7.2 |
| 15 | | none | — | | | 1.2 | — |
| 16 | VCHDO | 1-pyrenemethanol | 6.7 | DPS-C$_1$C$_{12}$ | 180 | 3.9 | 2.1 |
| 17 | | 9-anthracenemethanol | 6.7 | | | 2.5 | 1.4 |

TABLE 4-continued

Kinetic Data for Photosensitized Polymerizations

| Entry | Monomer | Photosensitizer | Conc. (mol %) | P.I./conc. (mol %) | Light Intens. (mJ/cm$^2$ min) | Rp/[M]$_o$ | AF |
|---|---|---|---|---|---|---|---|
| 18 | | none | — | | | 1.8 | — |
| 19 | VCHDO | 9-fluorenemethanol | 2.0 | IOC10/0.7 | 76 | 2.1 | 1.7 |
| 20 | | none | | | | 1.2 | — |
| 21 | VCHDO | 3-perylenemethanol | 0.5 | IOC10/0.1 | 377 | 20 | 16 |
| 22 | | | 0.2 | | | 18 | 15 |
| 23 | | | — | | | 1.2 | — |
| 24 | CHO | 3-perylenemethanol | 0.2 | IOC10/0.01 | 178 | 24 | 11 |
| 25 | | | | | | 2.1 | — |

Figure 10:
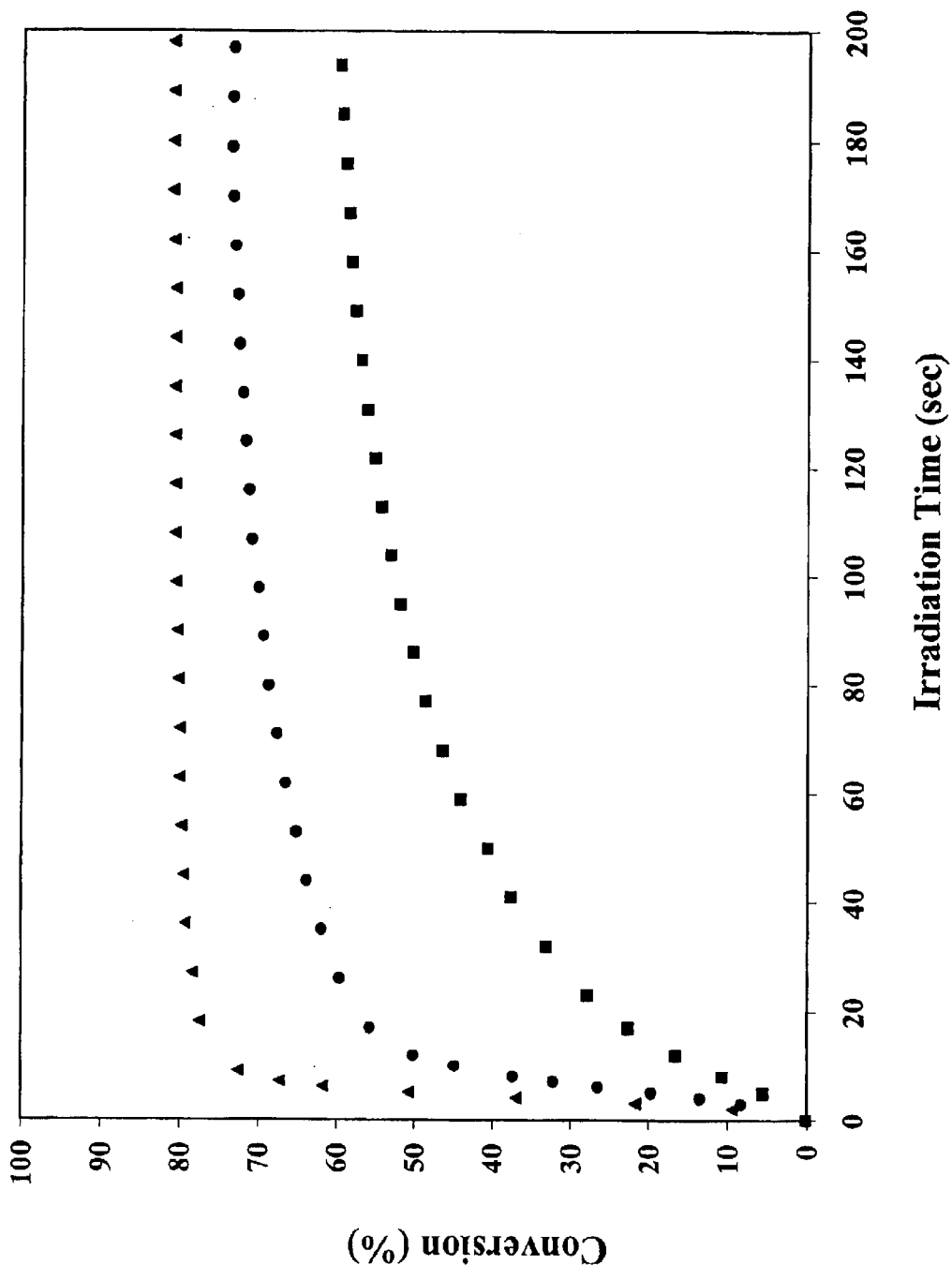
FIG. 10.—Study of the cationic photopolymerization of 4-vinylcyclohexene dioxide in the presence of 6.7% pyrenemethanol (▲), 6.7% 9-anthracene methanol (●), and without a photosensitizer (■) (0.67% IOC 10, light intensity 175 mJ/cm² min).
Figure 11:
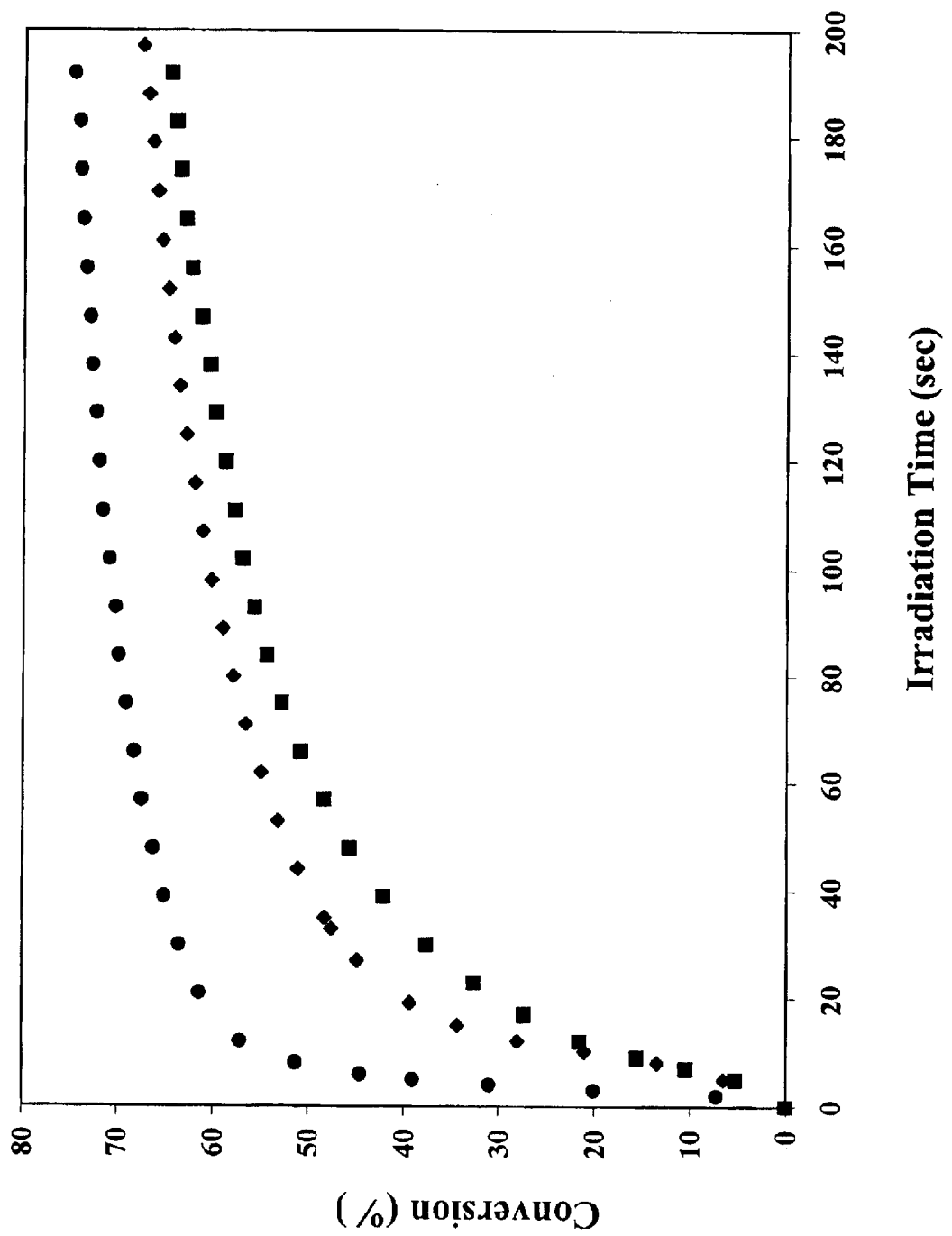
FIG. 11.—Comparison of the effects of 6.0% 1-pyrenemethanol (●), 6.0% benzyl alcohol (♦) and no photosensitizer (■) on the photopolymerization of 4-vinylcyclohexene dioxide (0.60% SOC10, light intensity 180 mJ/cm² min).

FIG. 10 shows a study in which 1-pyrenemethanol and 9-anthracenemethanol were compared as photosensitizers in the polymerization of the difunctional epoxide monomer, 4-vinylcylcohexene dioxide (VCHDO) using IOC10 as the photoinitiator. Also included in this figure for comparison is a kinetic curve in which in which no photosensitizer was included. Even at the low light intensity used (173 mJ/cm$^2$-min) using broad band UV irradiation, considerable enhancement (Table 4, entries 1 and 2; AF=10, 1-pyrenemethanol; 4.5, 9-anthracenemethanol) of the rate of photopolymerization was observed when the photosensitizers were employed. The broader and more intense spectrum of 1-pyrenemethanol makes it a much better photosensitizer than 9-anthracenemethanol. FIG. 11 compares the photopolymerizations of the same monomer using 1-pyrenemethanol with an equimolar amount of benzyl alcohol as well as with no photosensitizer present (entries 4–6). This study was carried out using SOC10 as the photoinitiator. The considerably higher rate of photopolymerization observed for 1-pyrenemethanol as compared to when either benzyl alcohol was used can be attributed to the effect of the photosensitization and not to acceleration due to involvement of the alcohol portion of this molecule in the activated monomer. A comparison of the rates of polymerization in the presence and absence of benzyl alcohol shows only a slight elevation of the rate in the presence of 6.0% benzyl alcohol. Previous work has indicated that both the acceleration of cationic ring-opening polymerizations due to either the activated monomer mechanism or the free radical induced decomposition mechanism requires relatively large (10–20%) amounts of benzyl alcohol. Very similar results were observed when VCHDO was replaced by either limonene dioxide (LDO) (entries 7–9) or by 3,4-epoxycyclohexylmethyl 3',4'-epoxycyclohexanecarboxylate (ERL) entries (10, 11). Reduction in either the relative concentrations of the photosensitizer, the photoinitiator or the light intensity (entries 12–15) still produces excellent photosensitization effects using 1-pyrenemethanol. When the dialkylphenacylsulfonium salt, S-methyl-S-n-dodecyl phenacylsulfonium hexafluoroantimonate (DPS-C$_1$C$_{12}$), was used as a photoinitiator together with photosensitizer 1-pyrenemethanol (FIG. 12; Table 4, entries 16–18), a similar rate enhancement was observed. It may be noted that hydroxymethylated polynuclear hydrocarbon photosensitizers are especially advantageous since they are effective for all three types of onium salt photoinitiators used in this investigation.

In an effort to determine whether there is an optimum concentration of photosensitizer, the polymerization of 4-vinylcyclohexene dioxide was carried out using 0.5, 1.0 and 2.0% 1-pyrenemethanol together with 0.7% IOC10 as the photoinitiator. The results are given in FIG. 13. Dramatic acceleration of the polymerization of this monomer is observed at all three concentrations of this photosensitizer and to very nearly the same degree. This indicates that the photosensitization effect is already saturated at 0.5% of 1-pyrenemethanol due to the high optical density of the photosensitizer in the monomer solution in the long wavelength region of the UV spectrum. It is also worth noting that the light intensity used in this study was only 85 mJ/cm$^2$ min and yet the reactivity of the polymerization mixture under these conditions was still very high. In commercial systems, the light intensity is often of the order of 2000 mJ/cm$^2$ min or higher.

Figure 12:
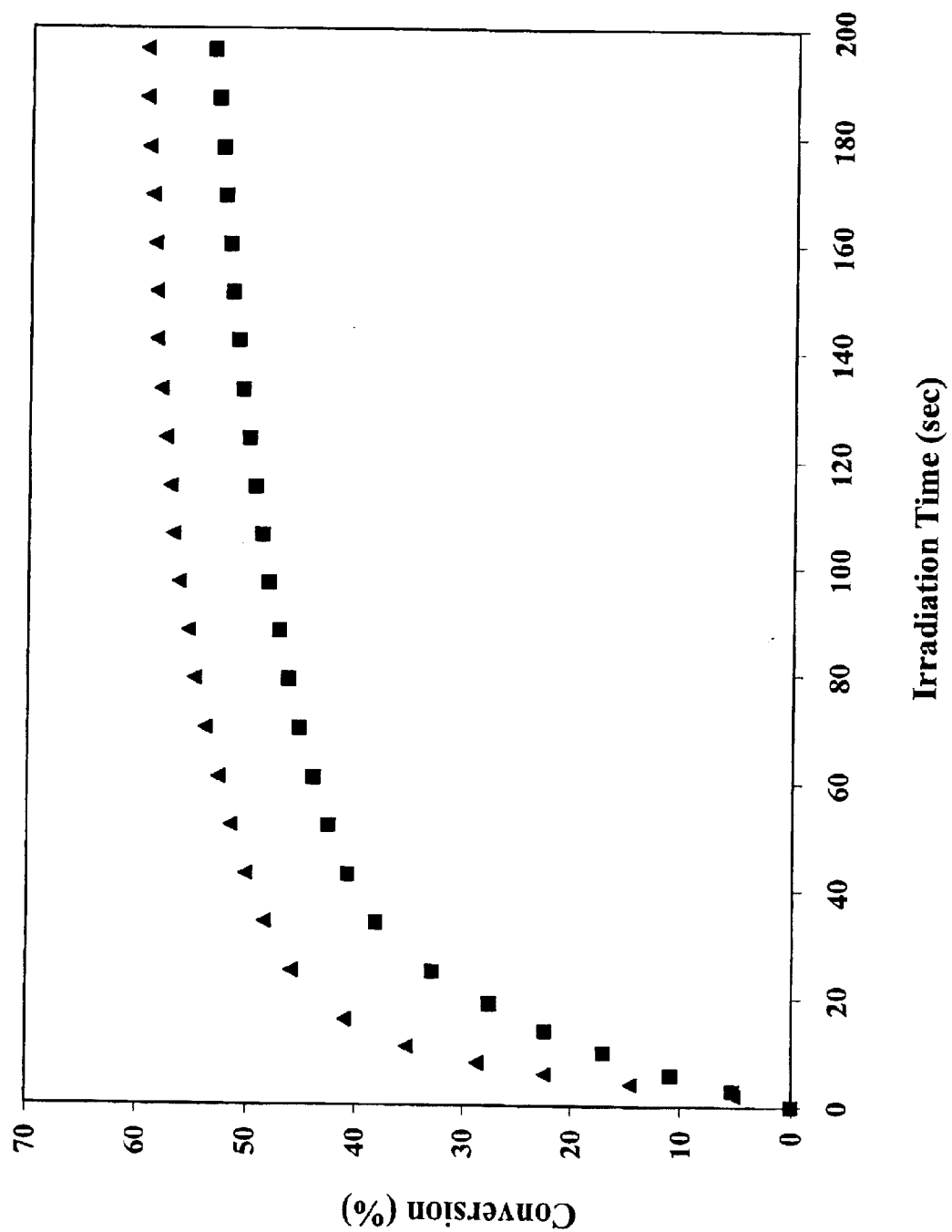
FIG. 12.—Comparison of the effects of 6.0% 1-pyrenemethanol (▲) and 6.0% benzyl alcohol (■) on the photopolyinerization of 4-vinylcyclohexene dioxide (0.60% DSP-$C_1C_{12}$, light intensity 180 mJ/cm² min).
Figure 13:
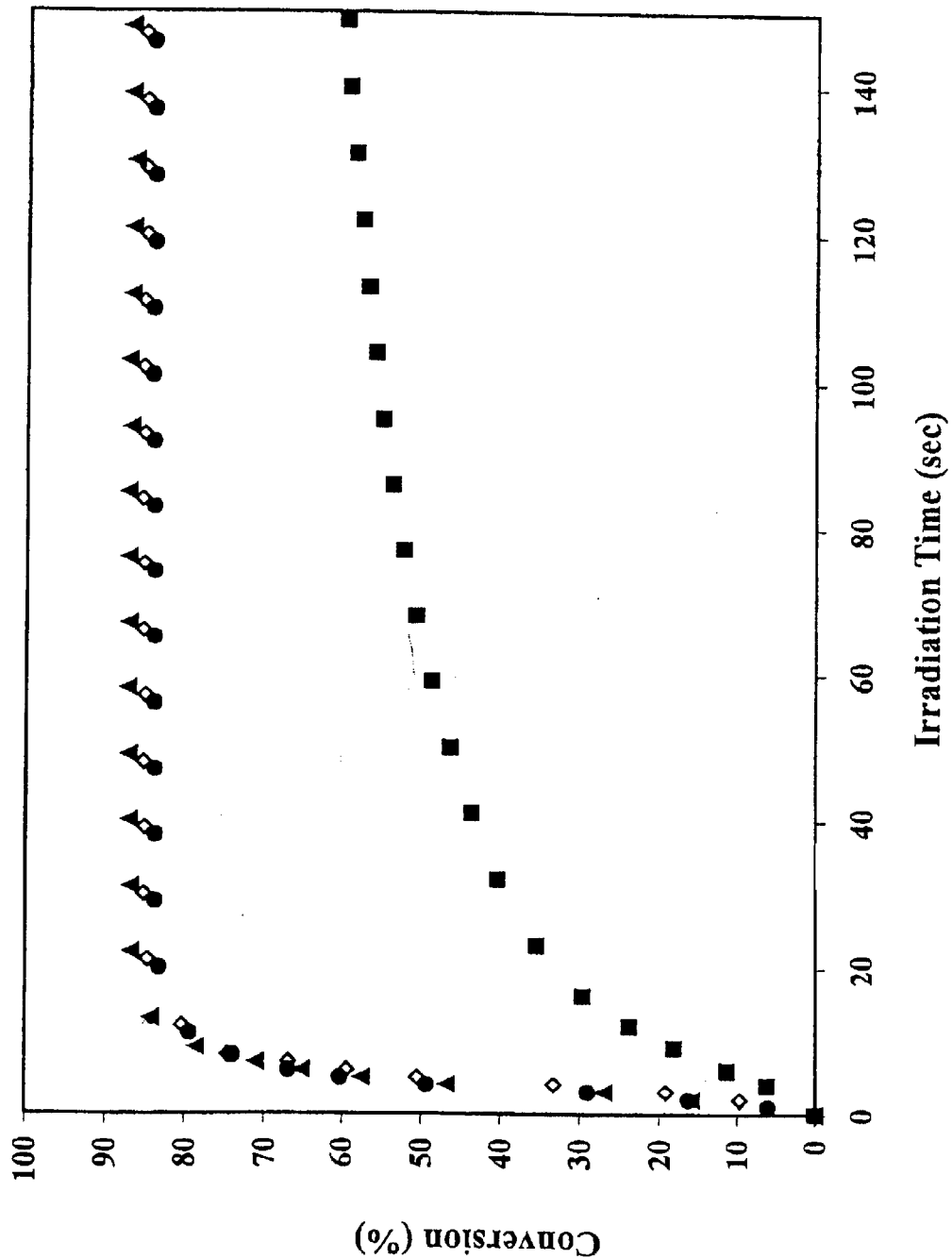
FIG. 13.—Kinetic study of the cationic photopolymerization of 4-vinylcyclohexene dioxide in the presence of 0% (■), 2.0% (♦), 1.0% (●) and 0.5% (▲) of 1-pyrenemethanol (0.70% IOC 10, light intensity 176 mJ/cm² min).
Figure 14:
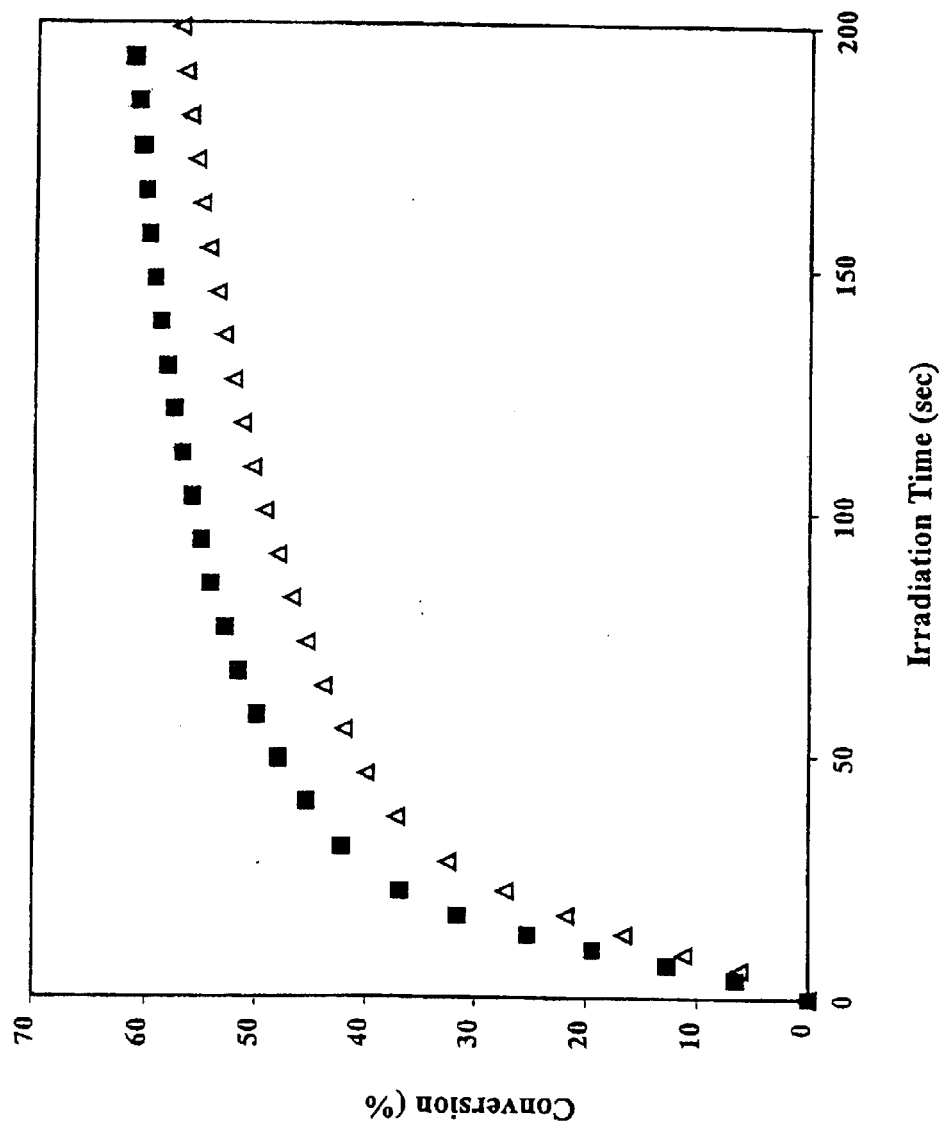
FIG. 14.—FT-RTIR study of the cationic photopolymerization of 4-vinylcyclohexene dioxide in the presence of 2.0% 9-fluorenemethanol (■) and in the absence of a photosensitizer (Δ) (0.70% IOC 10, light intensity 75.8 mJ/cm² min).
Figure 15:
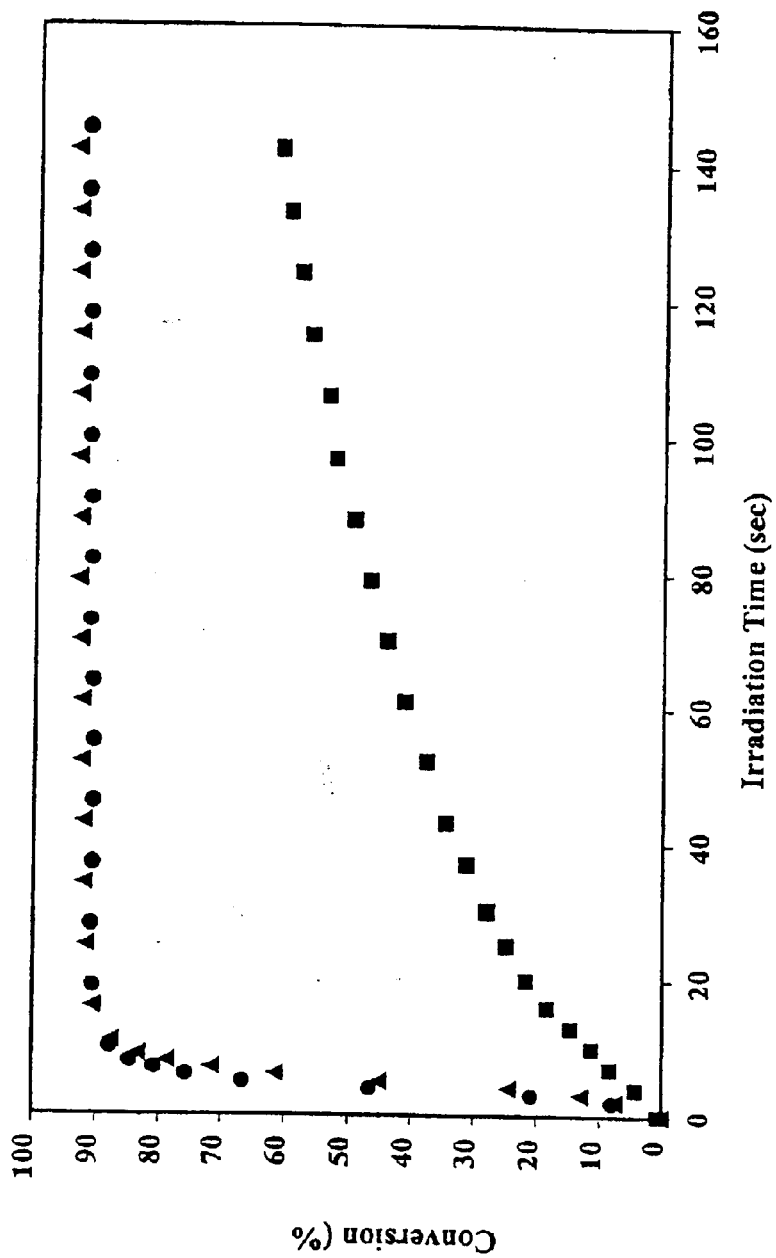
FIG. 15.—FT-RTIR study of the cationic photopolymerization of 4-vinylcyclohexene dioxide with 0.1 mol % IOC10 in the presence of 0 mol % (■), 0.2 mol % (▲) and 0.5 mol % (●) 3-perylenemethanol (light intensity 377 mJ/cm² min).
Figure 16:
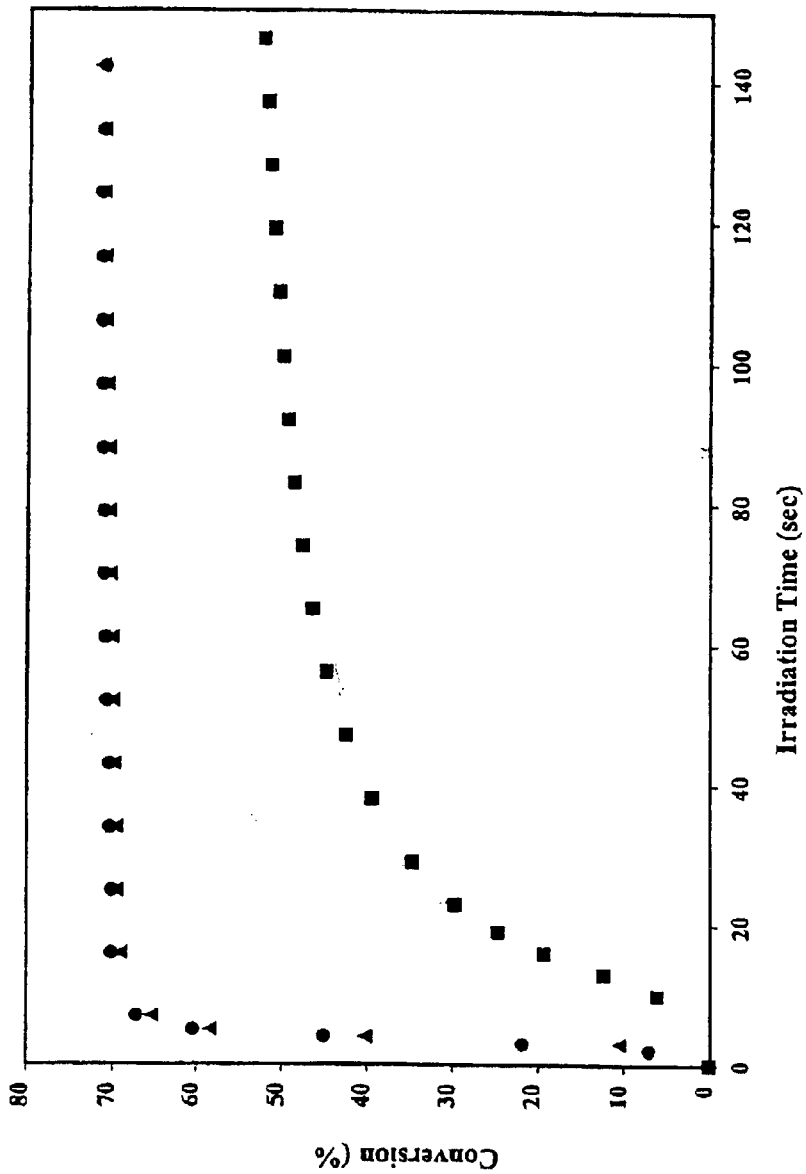
FIG. 16.—Kinetic study of the cationic photopolymerization of cyclohexene oxide (CHO) using 0.01 mol % IOC10 in the absence of a photosensitizer (■) and with 0.5 mol % (●) and 0.2 mol % (▲) 3-perylenemethanol (light intensity 178 mJ/cm² min).

Two additional photosensitizers, 9-fluorenemethanol and 3-perylenemethanol were evaluated and the results are shown in FIGS. 12 and 13. While 9-fluorenemethanol is a relatively week photosensitizer (Table 4, entries 19 and 20, AF=1.7), 3-perylenemethanol displays excellent photosensitization characteristics for IOC10. Essentially identical conversion versus time curves were obtained when 0.5 and 0.2% 3-perylenemethanol was used in the polymerization of VCHDO. AF values of 16 and 15 respectively, were determined for these polymerizations (Table 4, entries 21 and 22). The difference between the performances of the two photosensitizers can be rationalized by a comparison of the UV absorption spectra of the two different photosensitizers as shown in Table 2. The presence of intense, long wavelength absorption bands in 3-perylenemethanol and their absence in 9-fluorenemethanol accounts for the large difference in their efficiency in photosensitization. In addition, the electron-rich perylene nucleus is much more easily oxidized than the corresponding fluorene nucleus and, in addition, more readily stabilizes the cation-radical that is formed. A FT-RTIR study of the 3-perylenemethanol photosensitized polymerization of the monofunctional epoxide, cyclohexene oxide is shown in FIG. 16. At a concentration of 0.2 mol % of the photosensitizer, the polymerization is markedly accelerated (AF=11) as compared to a parallel experiment in which no photoinitiator is present.

Figure 17:
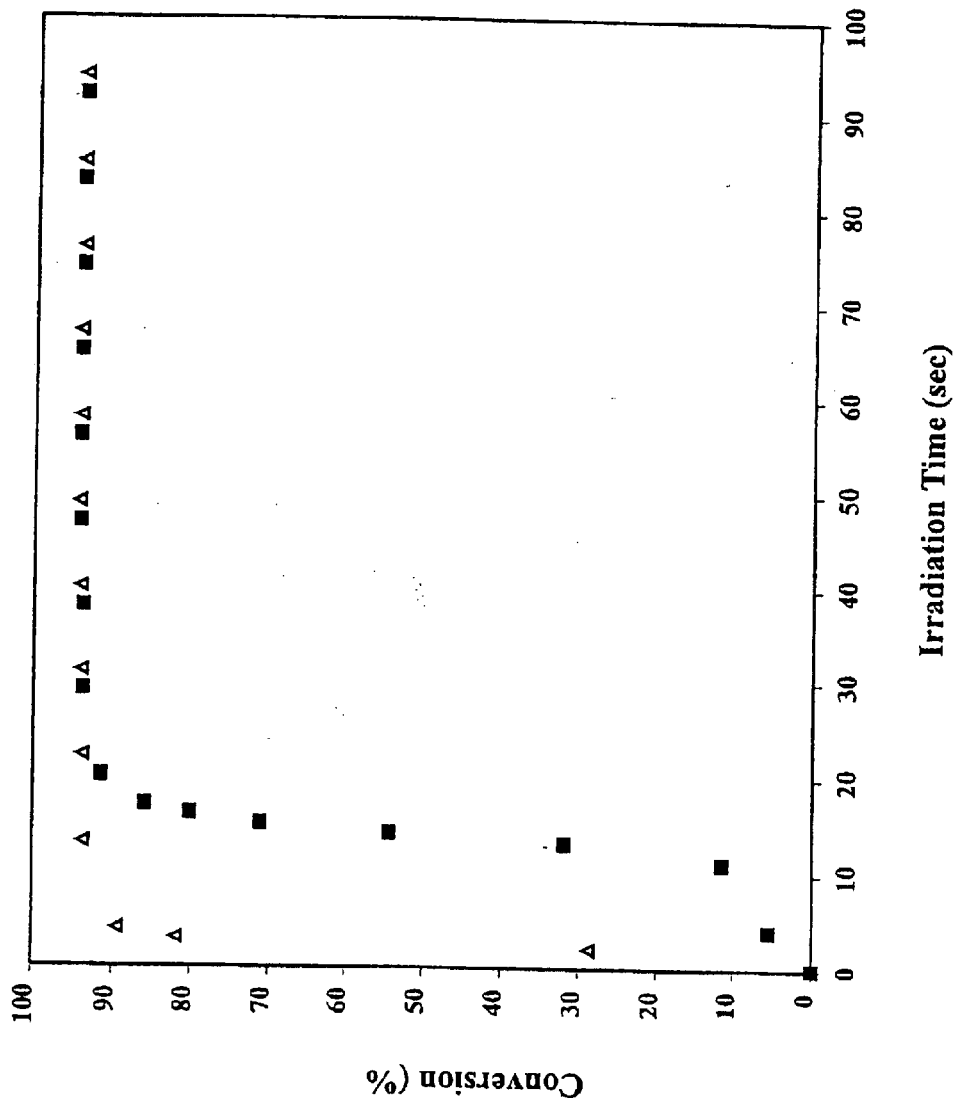
FIG. 17.—FT-RTIR study of the cationic photopolymerization of 2-chloroethyl vinyl ether (CEVE) with 1.0 mol % IOC10 using 0% (■) and 0.5 mol % (Δ) 1-pyrenemethanol (light intensity 194 mJ/cm² min).
Figure 18:
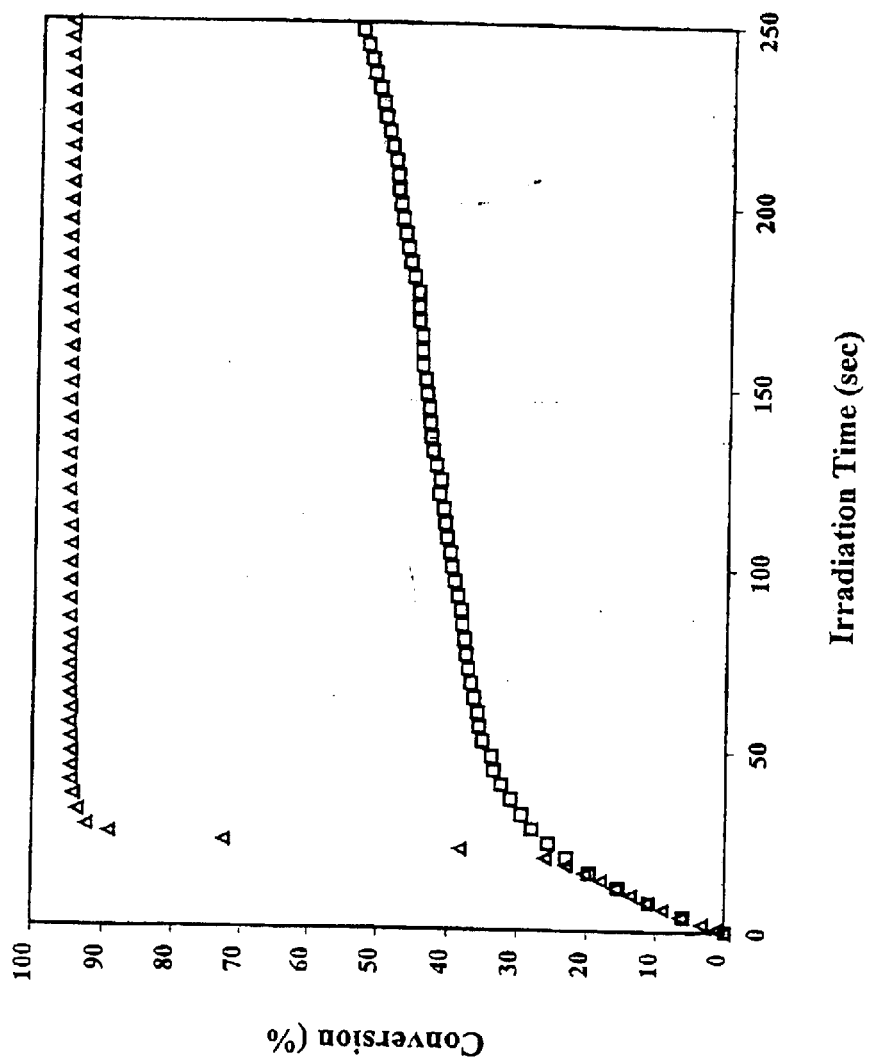
FIG. 18.—Photopolymerization of bis(3-ethyl-3-oxetanylmethyl)ether in the presence (Δ) of 0.5 mol % 1-pyrenemethanol and (□) without a photosensitizer (1.0 mol % IOC10; light intensity 401 mJ/cm² min).

The polymerization of vinyl ethers is much more rapid than epoxides. FIG. 17 shows the effect of photosensitization by 1-pyrenemethanol on the polymerization of 2-chloroethyl vinyl ether. This very reactive monomer contained traces of base as a polymerization inhibitor that was not removed prior to polymerization. Comparison with a control polymerization in which no photosensitizer was present reveals that in the presence of the photosensitizer the inhibition period is markedly reduced. This appears to be due to the photogeneration of a large amount of acid when the photosensitizer is present that rapidly consumes the basic inhibitor. In contrast, the direct photolysis of the photoinitiator results in the slow consumption of monomer until the inhibitor is consumed. Thereafter, rapid polymerization ensues. The cationic photopolymerization of oxetanes proceeds at rates similar to those of epoxides. The photopolymerization of the monomer bis(3-ethyl-3-oxetanylmethyl) ether is shown in FIG. 18 carried out in the presence and absence of 1-pyrenemethanol as a photoinitiator. As in the previous case, this difunctional monomer also appears to contain traces of basic inhibitors that slow the initial portion of the polymerizations. However, when the photosensitizer is used, the inhibition period is markedly shortened and polymerization proceeds rapidly to high conversion. In contrast, the direct polymerization without the photosensitizer does not exhibit a rate acceleration and the conversion remains low even after relatively long irradiation times.

Benzyl alcohol and its analogs with electron donating substituents are useful accelerators for the diaryliodonium salt photoinitiated cationic polymerization of epoxide monomers. Particularly effective as accelerators are 3,4-dimethoxybenzyl alcohol and piperonyl alcohol. Hydroxymethylated polynuclear aromatic hydrocarbons were very effective at low concentrations for the photosensitization of various types of onium salt photoinitiators in the long wavelength UV and visible regions. It has also been shown that benzyl alcohols are effective in accelerating the polymerization rates of several different types of commonly available epoxide monomers.

Hydroxymethyl functionallized photosensitizers provide several simultaneous advantages for the cationic ring-opening photopolymerization of cyclic ethers such as epoxides and oxetanes. First, the compounds function as an electron-transfer photosensitizer for the onium salt. Second, the presence of the polar alcohol group contributes to enhanced solubility of the photosensitizers in the monomers. Third, these compounds accelerate the polymerization of these monomers due to their ability to participate in the activated monomer mechanism. Especially, in those cases where multifunctional monomers are employed, the photosensitizers provide both higher conversions due to chain transfer and the delay of the onset of crosslinking. Fourth, the ethers that result from the their condensation with the monomer during polymerization can also participate in the free radical induced chain decomposition of the onium salt photoinitiator. Lastly, the photosensitizers are covalently bound as ether end groups into the polymers that are formed, reducing their toxicity and volatility. It is further expected that the polymer-bound ethers that are formed will have substantially the same UV absorption characteristics as the parent hydroxymethyl compounds and likewise provide a photosensitizing function.

What is claimed is:

1. A cationically photopolymerizable composition comprising
   a. at least one epoxy monomer;
   b. at least one cationic photoinitiator; and
   c. at least one accelerator comprising a compound of formula

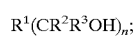
   $R^1(CR^2R^3OH)_n$;

wherein $R^1$ is selected from phenyl, polycyclic aryl, and polycyclic heteroaryl, each optionally substituted with one or more electron donating groups;
   $R^2$ and $R^3$ are independently selected from hydrogen, alkyl, aryl, alkylaryl, substituted alkyl, substituted aryl and substituted alkylaryl; and
   n is an integer from 1 to 10.

2. A cationically photopolymerizable composition according to claim 1, wherein n is 1.

3. A cationically photopolymerizable composition according to claim 1, wherein $R^1$ is phenyl.

4. A cationically photopolymerizable composition according to claim 1, wherein $R^1$ is polycyclic aryl or polycyclic heteroaryl.

5. A cationically photopolymerizable composition according to claim 1, wherein $R^1$ is substituted with at least one electron donating group.

6. A cationically photopolymerizable composition according to claim 5, wherein said at least one electron donating group is selected from alkoxy, vinyl, substituted vinyl, and —OR$^4$O—, wherein R$^4$ is an independently selected divalent alkyl residue.

7. A cationically photopolymerizable composition according to claim 5, wherein said at least one electron donating group is alkoxy.

8. A cationically photopolymerizable composition according to claim 5, wherein said at least one electron donating group is methoxy.

9. A cationically photopolymerizable composition according to claim 5, wherein said at least one electron donating group is —OCH$_2$O—.

10. A cationically photopolymerizable composition according to claim 4, wherein $R^1$ is derived from anthracene, fluorene, pyrene, perylene, carbazole, phenothiazine, or thianthrene.

11. A cationically photopolymerizable composition according to claim 1, wherein at least one of $R^2$ and $R^3$ is hydrogen.

12. A cationically photopolymerizable composition according to claim 1, wherein at least one of $R^2$ and $R^3$ is methyl.

13. A cationically photopolymerizable composition according to claim 1, wherein at least one of $R^2$ and $R^3$ is phenyl.

14. A cationically photopolymerizable composition according to claim 1, wherein $R^2$ and $R^3$ are each hydrogen.

15. A cationically photopolymerizable composition according to claim 1, wherein $R^2$ is hydrogen and $R^3$ is methyl or phenyl.

16. A cationically photopolymerizable composition according to claim 1, wherein $R^1$ is additionally substituted with one or more groups selected from electron withdrawing groups and electronically inactive groups.

17. A cationically photopolymerizable composition according to claim 1, wherein said accelerator is piperonyl alcohol.

18. A cationically photopolymerizable composition according to claim 1, wherein said accelerator is 1-pyrenemethanol.

19. A cationically photopolymerizable composition according to claim 1, wherein said accelerator is 9-anthracenemethanol.

20. A cationically photopolymerizable composition according to claim 1, wherein said accelerator is 9-fluorenemethanol.

21. A cationically photopolymerizable composition according to claim 1, wherein said accelerator is 3-perylenemethanol.

22. A cationically photopolymerizable composition according to claim 1, wherein said at least one epoxy monomer comprises at least one multifunctional epoxy monomer.

23. A cationically photopolymerizable composition according to claim 1, wherein said at least one epoxy monomer is selected from the group consisting of vinylcyclohexene dioxide, limonene dioxide, 1,3-Bis[2-(3,4- epoxycyclohexyl)ethyl]-1,1,3,3-tetramethyldisiloxane, 3,4-epoxycyclohexyl-methyl-3,4-epoxycyclohexane carboxylate, bis-phenol A diglycidylether and cyclohexene oxide.

24. A cationically photopolymerizable composition according to claim 1, comprising
   100 parts by weight of said at least one epoxy monomer;
   0.01–10 parts by weight of said at least one cationic photoinitiator; and
   0.01–10 parts by weight of said at least one accelerator.

25. A cationically photopolymerizable composition according to claim 1, comprising:
   100 parts by weight of said at least one epoxy monomer;
   0.01–10 parts by weight of said at least one cationic photoinitiator; and
   0.01–1 parts by weight of said at least one accelerator.

26. A cationic photopolymerization process comprising:
   a. formulating a cationically photopolymerizable composition comprising
      i. at least one epoxy monomer;
      ii. at least one cationic photoinitiator; and
      iii. at least one accelerator comprising phenolic or a compound of formula $R^1(CR^2R^3OH)_n$;
      wherein $R^1$ is selected from phenyl, polycyclic aryl, and polycyclic heteroaryl, each optionally substituted with one or more electron donating group substituted phenyl;
      $R^2$ and $R^3$ are independently selected from hydrogen, alkyl, aryl, alkylaryl, substituted alkyl, substituted aryl and substituted alkylaryl; and
      n is an integer from 1 to 10; and
   b. irradiating the cationically photopolymerizable composition;
   whereby the epoxy monomer is polymerized and at least a portion of the accelerator is incorporated into the polymer.

* * * * *

UNITED STATES PATENT AND TRADEMARK OFFICE
CERTIFICATE OF CORRECTION

PATENT NO. : 6,863,701 B2
DATED : March 8, 2005
INVENTOR(S) : Crivello

It is certified that error appears in the above-identified patent and that said Letters Patent is hereby corrected as shown below:

Title page,
Item [54], Title, delete "ACCELERATORS FOR CATIONIC PHOTOPOLYMERIZATIONS" and insert -- ACCELERATORS FOR CATIONIC PHOTOPOLYMERIZATION --.

Column 24,
Line 3, delete the words "phenolic or" after the word "comprising"

Signed and Sealed this

Seventeenth Day of May, 2005

JON W. DUDAS
*Director of the United States Patent and Trademark Office*